US012660627B2

(12) United States Patent
Lee et al.

(10) Patent No.: US 12,660,627 B2
(45) Date of Patent: Jun. 16, 2026

(54) REINFORCEMENT STRUCTURES FOR CHIP-INTERPOSER AND INTERPOSER-SUBSTRATE BONDING AND METHODS OF MAKING THE SAME

(71) Applicant: Taiwan Semiconductor Manufacturing Company Limited, Hsinchu (TW)

(72) Inventors: Yu Chen Lee, Hsinchu City (TW); Chin-Hua Wang, New Taipei City (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 484 days.

(21) Appl. No.: 18/124,752

(22) Filed: Mar. 22, 2023

(65) Prior Publication Data

US 2024/0321772 A1 Sep. 26, 2024

(51) Int. Cl.
*H10W 42/00* (2026.01)
*H10W 70/60* (2026.01)
(Continued)

(52) U.S. Cl.
CPC ........ *H10W 42/121* (2026.01); *H10W 70/611* (2026.01); *H10W 90/401* (2026.01); *H10W 72/072* (2026.01); *H10W 72/07236* (2026.01); *H10W 72/073* (2026.01); *H10W 74/15* (2026.01); *H10W 90/724* (2026.01); *H10W 90/734* (2026.01)

(58) Field of Classification Search
None
See application file for complete search history.

(56) References Cited

U.S. PATENT DOCUMENTS

2017/0117200 A1*  4/2017  Kim ....................... H01L 24/97
2018/0261528 A1*  9/2018  Chen ...................... H01L 23/36
(Continued)

FOREIGN PATENT DOCUMENTS

CN      113937068 A  *  1/2022  ............. H01L 25/18
CN      114267645 A  *  4/2022  ......... H01L 25/0652
EP       3509097 A1  *  7/2019  ............. H01L 25/18

*Primary Examiner* — Telly D Green
(74) *Attorney, Agent, or Firm* — The Marbury Law Group, PLLC

(57) ABSTRACT

An embodiment semiconductor package includes an interposer, a first semiconductor die electrically coupled to a first side of the interposer, and a first reinforcement structure that is mechanically coupled to the interposer and to the first semiconductor die, such that the first reinforcement structure is a solid structure that is adhered to the interposer and to the first semiconductor die and includes an adhesive strength that is greater than 5 N/mm$^2$ and less than 10 N/mm$^2$. The first reinforcement structure is formed at a corner or at an edge of the first semiconductor die and may have a modulus that is greater than 0.1 GPa and less than 1.0 GPa. The semiconductor package may further include a second semiconductor die electrically coupled to the first side of the interposer and a second reinforcement structure that is mechanically coupled to the interposer and to the second semiconductor die.

20 Claims, 16 Drawing Sheets

(51) Int. Cl.
H10W 90/00 (2026.01)
*H10W 72/00* (2026.01)
*H10W 74/15* (2026.01)

(56) References Cited

U.S. PATENT DOCUMENTS

| | | | |
|---|---|---|---|
| 2019/0115269 A1* | 4/2019 | Pan | H01L 23/04 |
| 2021/0125885 A1* | 4/2021 | Chen | H01L 24/20 |
| 2021/0202336 A1* | 7/2021 | Chang | H01L 24/32 |
| 2023/0378042 A1* | 11/2023 | Wang | H01L 25/0655 |
| 2024/0006340 A1* | 1/2024 | Lai | H01L 23/562 |

* cited by examiner

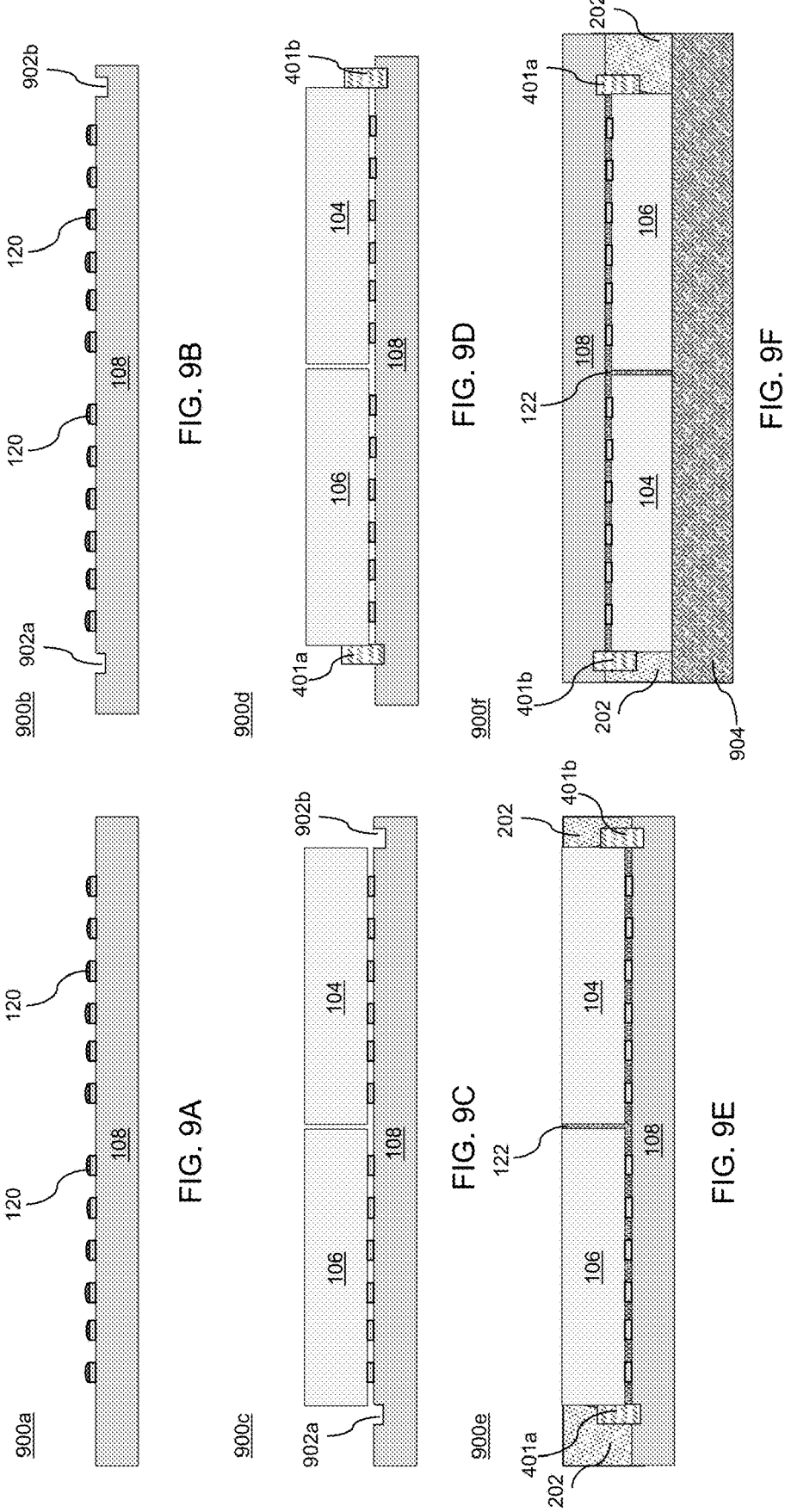

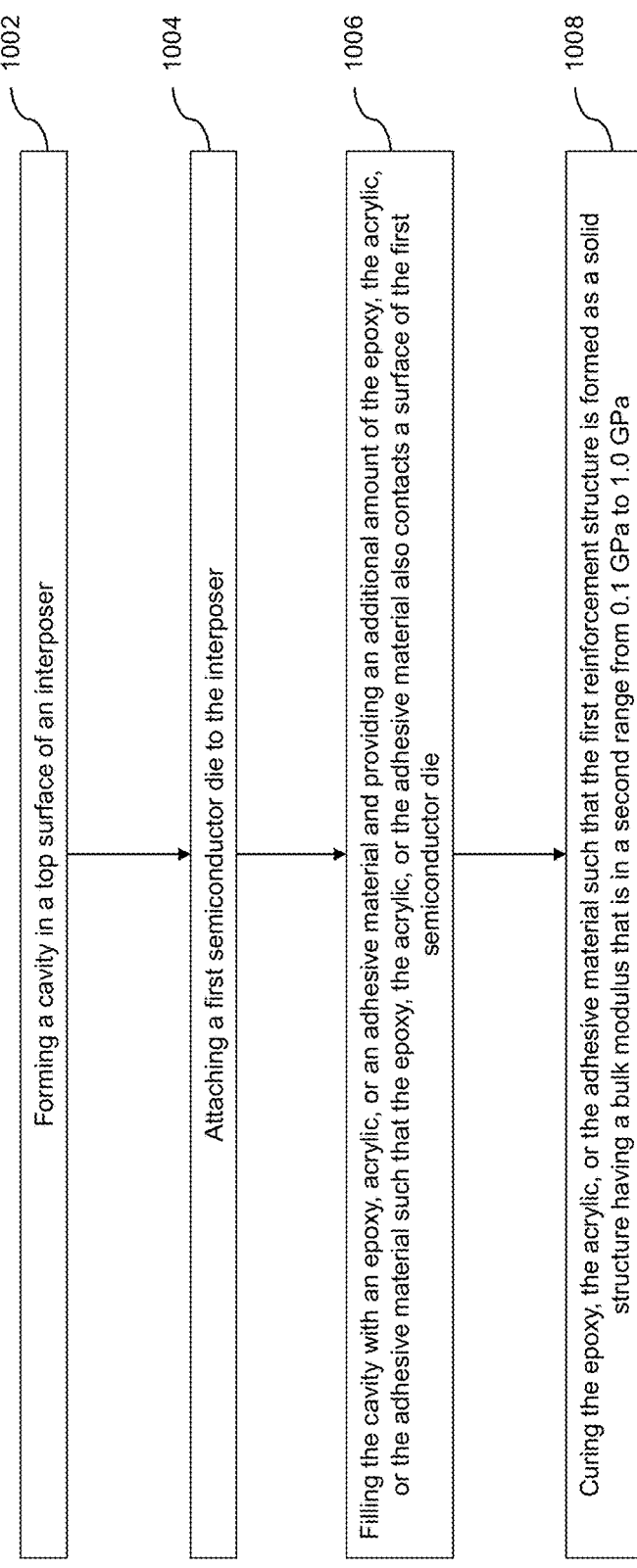

1002 — Forming a cavity in a top surface of an interposer

1004 — Attaching a first semiconductor die to the interposer

1006 — Filling the cavity with an epoxy, acrylic, or an adhesive material and providing an additional amount of the epoxy, the acrylic, or the adhesive material such that the epoxy, the acrylic, or the adhesive material also contacts a surface of the first semiconductor die 1008 — Curing the epoxy, the acrylic, or the adhesive material such that the first reinforcement structure is formed as a solid structure having a bulk modulus that is in a second range from 0.1 GPa to 1.0 GPa

REINFORCEMENT STRUCTURES FOR CHIP-INTERPOSER AND INTERPOSER-SUBSTRATE BONDING AND METHODS OF MAKING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds or thousands of integrated circuits may be manufactured on a single semiconductor wafer, and individual dies on the wafer are singulated by sawing between the integrated circuits along scribe lines. The individual dies may be packaged separately, in multi-chip modules, or in other types of packaging, for example.

As semiconductor packages have become more complex, package sizes have tended to become larger to accommodate greater numbers of integrated circuits and/or dies per package. These larger and more complex semiconductor packages have led to additional challenges in making effective and reliable interconnections to the semiconductor package. Other challenges includes mechanical issues related to thermal expansion mismatch between package components leading to warpage, cracking, delamination, etc.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A is a vertical cross-sectional view of an intermediate structure that may be used in the formation of a semiconductor package that includes a first die-interposer reinforcement structure and a second die-interposer reinforcement structure, according to various embodiments.

FIG. 9B is a vertical cross-sectional view of a further intermediate structure that may be used in the formation of a semiconductor package that includes a first die-interposer reinforcement structure and a second die-interposer reinforcement structure, according to various embodiments.

FIG. 9C is a vertical cross-sectional view of a further intermediate structure that may be used in the formation of a semiconductor package that includes a first die-interposer reinforcement structure and a second die-interposer reinforcement structure, according to various embodiments.

FIG. 9D is a vertical cross-sectional view of a further intermediate structure that may be used in the formation of a semiconductor package that includes a first die-interposer reinforcement structure and a second die-interposer reinforcement structure, according to various embodiments.

FIG. 9E is a vertical cross-sectional view of a further intermediate structure that may be used in the formation of a semiconductor package that includes a first die-interposer reinforcement structure and a second die-interposer reinforcement structure, according to various embodiments.

FIG. 9F is a vertical cross-sectional view of a further intermediate structure that may be used in the formation of a semiconductor package that includes a first die-interposer reinforcement structure and a second die-interposer reinforcement structure, according to various embodiments.

FIG. 10 is a flowchart illustrating various operations of a method of fabricating a package substrate, according to various embodiments.

DETAILED DESCRIPTION

Figure 1A:
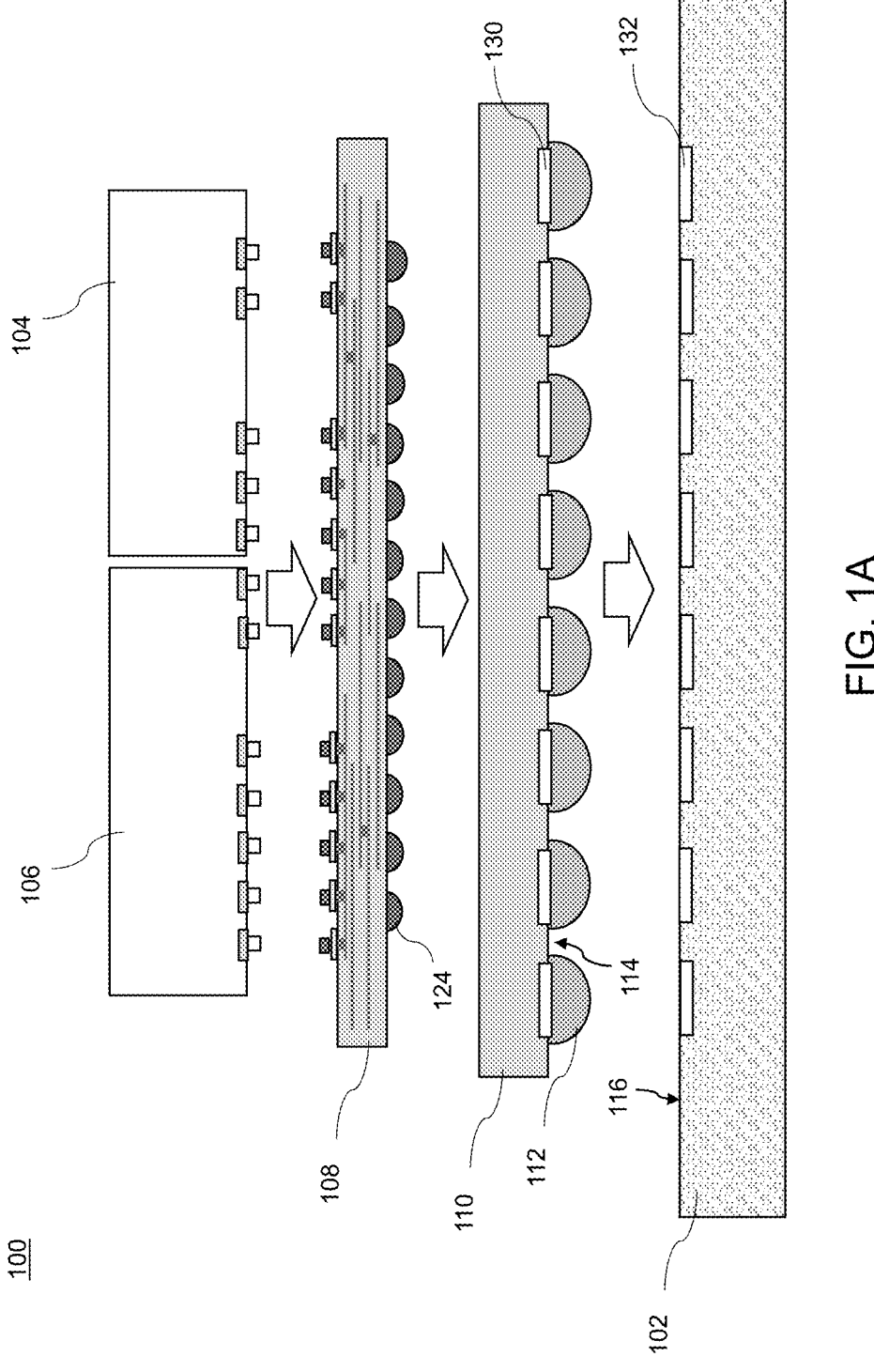
FIG. 1A is vertical cross-sectional exploded view of components of a semiconductor package during a package assembly and surface mounting process.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Generally, in a semiconductor package, a number of semiconductor integrated circuit (IC) dies (i.e., "chips") may be mounted onto a common substrate, which may also be referred to as a "package substrate." In some embodiments, electrical connections to the semiconductor package may be made by mounting the package substrate onto a support substrate containing electrical interconnects, such as a printed circuit board (PCB).

The various embodiments disclosed herein may provide improved methods for assembling semiconductor packages that may mitigate mechanical issues related to thermal expansion mismatch between package components that may otherwise cause warpage, cracking, delamination, etc. Package substrates may be reinforced with an external reinforcement structure that may reduce or eliminate warpage of the package substrate. Thermal expansion coefficient mismatch between the external reinforcement structure and other components, however, may give rise to cracking, delamination, and other mechanical degradation of the semiconductor package. To mitigate such issues related to thermal expansion coefficient mismatch, various disclosed embodiments may provide reinforcement structures formed within the interposer and/or package substrate. The reinforcement structures may have a higher modulus and lower thermal expansion coefficient relative to other portions of the package substrate to thereby reduce or eliminate thermal-stress-induced damage to the semiconductor package.

An embodiment semiconductor package may include an interposer, a first semiconductor die electrically coupled to a first side of the interposer, and a first die-interposer reinforcement structure that may be mechanically coupled to the interposer and to the first semiconductor die, such that the first die-interposer reinforcement structure is a solid structure that may be adhered to the interposer and to the first semiconductor die and may include an adhesive strength that is greater than 5 $N/mm^2$ and less than 10 $N/mm^2$. The first die-interposer reinforcement structure may be formed at a corner or at an edge of the first semiconductor die and may have a modulus (e.g., Young's modulus, bulk modulus, shear modulus) that is greater than 0.1 GPa and less than 1.0 GPa. The semiconductor package may further include a second semiconductor die electrically coupled to the first side of the interposer and a second die-interposer reinforcement structure that is mechanically coupled to the interposer and to the second semiconductor die.

A further embodiment semiconductor package may include an interposer, a first semiconductor die electrically coupled to a first side of the interposer, a package substrate electrically coupled to a second side of the interposer, and a first reinforcement structure (i.e., a die-interposer reinforcement structure or interposer-substrate reinforcement structure) that may be mechanically coupled to the interposer and to at least one of the first semiconductor die and the package substrate. The semiconductor package may further include a second semiconductor die electrically coupled to the first side of the interposer and a second reinforcement structure (i.e., a die-interposer reinforcement structure) that may be mechanically coupled to the second semiconductor die. In such an embodiment, the first reinforcement structure may be a die-interposer reinforcement structure that may be mechanically coupled to the first semiconductor die and may have an adhesive strength that is greater than 5 N/mm² and less than 10 N/mm² and modulus that is greater than 0.1 GPa and less than 1.0 GPa. In various embodiments, the first reinforcement structure may be a die-interposer reinforcement structure that may be mechanically coupled to the first semiconductor die and may have a bottom surface formed below a top surface of the interposer. Alternatively, the first reinforcement structure may be an interposer-substrate reinforcement structure that may be mechanically coupled to the package substrate and may have a bottom surface formed below the top surface of the package substrate.

An embodiment method of forming a semiconductor package may include forming a cavity in a top surface of the interposer, attaching a first semiconductor die to an interposer, and forming a first reinforcement structure that is mechanically coupled to the interposer and to the first semiconductor die. In this regard, forming the first reinforcement structure may include filling the cavity with an epoxy, acrylic, or an adhesive material and providing an additional amount of the epoxy, the acrylic, or the adhesive material such that the epoxy, the acrylic, or the adhesive material also contacts a surface of the first semiconductor die. The method may further include curing the epoxy, the acrylic, or the adhesive material such that the first reinforcement structure is formed as a solid structure having a modulus that is greater than 0.1 GPa and less than 1.0 GPa and such that the first reinforcement structure is adhered to the interposer and to the first semiconductor die and has an adhesive strength that is greater than 5 N/mm² and less than 10 N/mm².

Figure 1B:
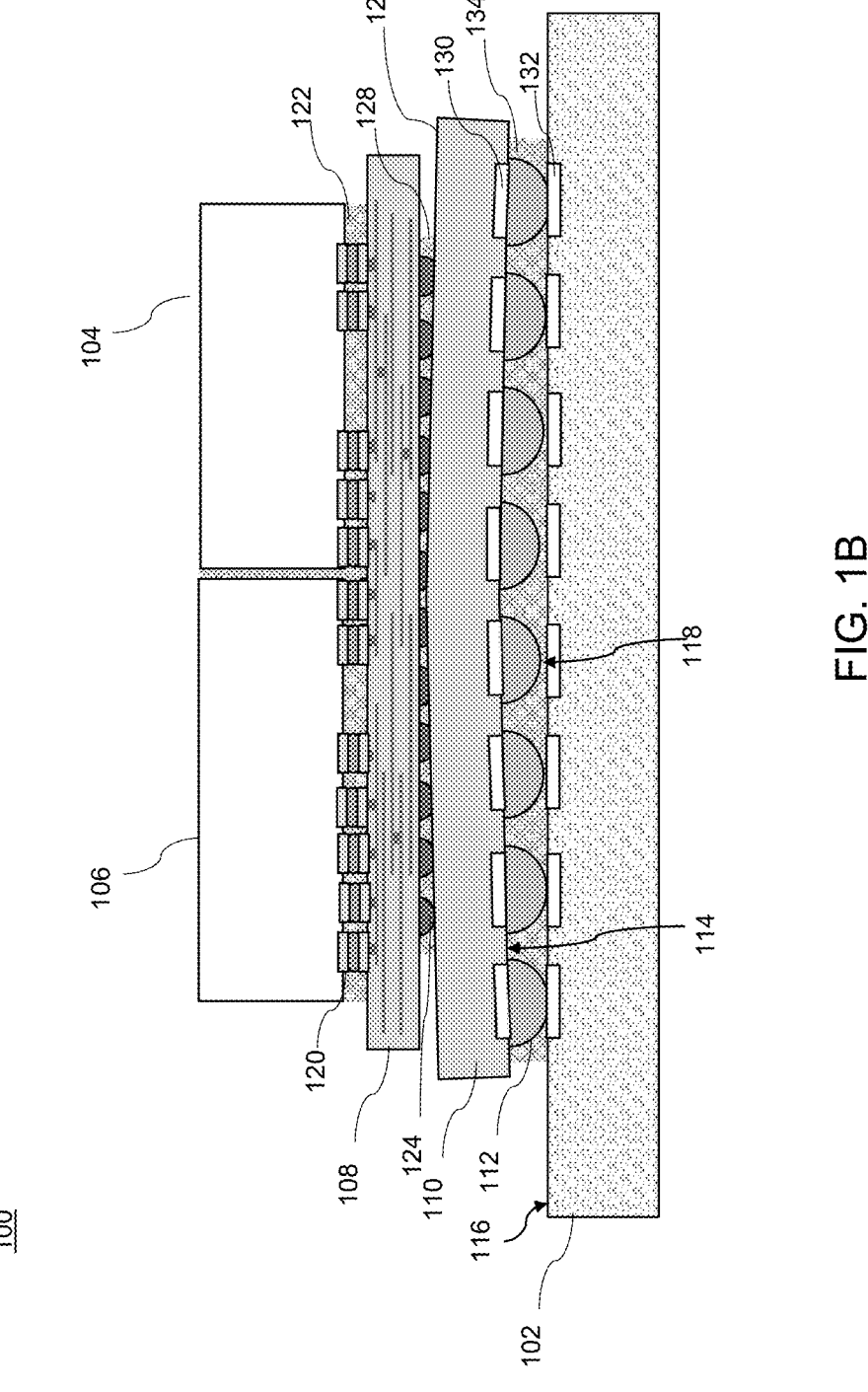
FIG. 1B is a vertical cross-sectional view illustrating an assembled semiconductor package mounted onto the surface of a support substrate.

FIG. 1A is vertical cross-sectional exploded view of components of a semiconductor package 100 during a package assembly and surface mounting process. FIG. 1B is a vertical cross-sectional view illustrating the assembled semiconductor package 100 mounted onto the surface of a support substrate 102, such as a printed circuit board (PCB). The semiconductor package 100 in this example is a chip-on-wafer-on-substrate (CoWoS)® semiconductor package, although it will be understood that a similar assembly and mounting process may be utilized for other types of semiconductor packages, such as integrated fan-out (InFO) semiconductor packages, flip-chip semiconductor packages, etc.

Referring to FIGS. 1A and 1B, the semiconductor package may include integrated circuit (IC) semiconductor devices, such as first semiconductor dies 104 and second semiconductor dies 106. During the package assembly process, the first semiconductor die 104 and the second semiconductor die 106 may be mounted on an interposer 108, and the interposer 108 containing the first semiconductor die 104 and the second semiconductor die 106 may be mounted onto a package substrate 110 to form a semiconductor package 100. The semiconductor package 100 may then be mounted to a support substrate 102, such as a printed circuit board (PCB), by mounting the package substrate 110 to the support substrate 102 using an array of solder balls 112 on the lower surface 114 of the package substrate 110.

A parameter that may ensure proper interconnection between the package substrate 110 and the support substrate 102 is the degree of co-planarity between the surfaces of the solder balls 112 that may be brought into contact with the mounting surface (i.e., the upper surface 116 of the support substrate 102 in FIG. 1A). A low degree of co-planarity between the solder balls 112 may result in instances of solder cold joints (i.e., insufficient melting of the solder material, resulting in a poor bond that is susceptible to cracking and separation) and/or solder bridging issues (i.e., solder material from one solder ball 112 contacting material from a neighboring solder ball 112, resulting in an unintended connection (i.e., electrical short)) during the reflow process.

Deformation of the package substrate 110, such as stress-induced warping of the package substrate 110, may be a contributor to low co-planarity of the solder balls 112 during surface mounting of the package substrate 110 onto a support substrate 102. FIG. 1B illustrates a package substrate 110 that includes a warpage deformation. The warp deformation of the package substrate 110 may result in variations of the distance between the lower surface 114 of the package substrate 110 and the upper surface 116 support substrate 102. Such deformation of the package substrate 110 may increase the risk of defective solder connections with the underlying support substrate 102. As shown in FIG. 1B, for example, a deformation of the package substrate 110 may cause at least some of the solder joints between the package substrate 110 and the support substrate 102 to fail completely, as indicated by the arrow 118 in FIG. 1B. In the exemplary embodiment shown in FIG. 1B, the deformation of the package substrate 110 may have a bow-shape or cup-shape such that a separation between the lower surface 114 of the package substrate 110 and the upper surface 116 of the support substrate 102 may be smallest at the periphery of the package substrate 110 and may increase towards the center of the package substrate 110.

Deformation of the package substrate 110 is not an uncommon occurrence, particularly in the case of semiconductor packages used in high-performance computing applications. These high-performance semiconductor packages 100 tend to be relatively large and may include a number of semiconductor dies (e.g., 104, 106) mounted to the package substrate 110, which may increase a likelihood that the package substrate 110 may be subject to warping or other deformations. Such deformations may present challenges to effective solder mounting of these types of package substrates 110 onto a support substrate 102.

According to various embodiments of this disclosure, a substrate for a semiconductor package 100 may include various substrate reinforcement structures 212 (e.g., see FIG. 3A) that may compensate for a deformation of the package substrate 110 so that the co-planarity of the solder balls 112 may be improved, thereby providing an improved solder connection between the package substrate 110 and the support substrate 102, as described in greater detail below. Other embodiments may include a die-interposer reinforcement structure 401 that is mechanically coupled to the interposer 108 and to one or more semiconductor dies (104, 106) and/or an interposer-substrate reinforcement structure 403 that is mechanically coupled to the interposer 108 and the package substrate 110 (e.g., see FIG. 4).

In various embodiments, the first semiconductor dies 104 may be three-dimensional devices, such as three-dimensional integrated circuits (3DICs), system-on-chip (SOC) or small outline integrated circuit (SoIC) devices. A three-dimensional semiconductor die 104 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional semiconductor die 104 may also be referred to as a "first die stack."

The second semiconductor die(s) 106 may be different from the first semiconductor die(s) 104 in terms of their structure, design and/or functionality. The one or more second semiconductor dies 106 may be three-dimensional semiconductor dies, which may also be referred to as "second die stacks." In some embodiments, the one or more second semiconductor dies 106 may include a memory device, such as a high bandwidth memory (HBM) device. In the example shown in FIGS. 1A and 1B, the semiconductor package 100 may include a SOC die stack 104 and an HBM die stack 106, although it will be understood that the semiconductor package 100 may include greater or fewer numbers of semiconductor dies.

Referring again to FIG. 1B, the first semiconductor dies 104 and second semiconductor dies 106 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer 108 are within the contemplated scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between the first semiconductor dies 104, the second semiconductor dies 106, and the underlying package substrate 110.

A plurality of metal bumps 120, such as microbumps, may electrically connect conductive bonding pads on the bottom surfaces of the first semiconductor dies 104 and second semiconductor dies 106 to the conductive bonding pads on the upper surface of the interposer 108. In one non-limiting embodiment, metal bumps 120 in the form of microbumps may include a plurality of first metal stacks, such as a plurality of Cu—Ni—Cu stacks, located on the bottom surfaces of the first semiconductor dies 104 and second semiconductor dies 106, and a plurality of second metal stacks (e.g., Cu—Ni—Cu stacks) located on the upper surface of the interposer 108. A solder material, such as tin (Sn), may be located between respective first and second metal stacks to electrically connect the first semiconductor dies 104 and the second semiconductor dies 106 to the interposer 108. Other suitable materials for the metal bumps 120 are within the contemplated scope of disclosure.

After the first semiconductor dies 104 and second semiconductor dies 106 are mounted to the interposer 108, a first underfill material portion 122 may optionally be provided in the spaces surrounding the metal bumps 120 and between the bottom surfaces of the first semiconductor dies 104, the second semiconductor dies 106, and the upper surface of the interposer 108 as shown in FIG. 1B. The first underfill material portion 122 may also be provided in the spaces laterally separating adjacent first semiconductor dies 104 and second semiconductor dies 106 of the semiconductor package 100. In various embodiments, the first underfill material portion 122 may be include of an epoxy-based material, which may include a composite of resin and filler materials.

Referring again to FIG. 1B, the interposer 108 may be mounted on the package substrate 110 that may provide mechanical support for the interposer 108 and the first semiconductor dies 104 and second semiconductor dies 106 that are mounted on the interposer 108. The package substrate 110 may include a suitable material, such as an organic material (e.g., a polymer and/or thermoplastic material), a semiconductor material (e.g., a semiconductor wafer, such as a silicon wafer), a ceramic material, a glass material, combinations thereof, etc. Other suitable substrate materials are within the contemplated scope of present disclosure. In various embodiments, the package substrate 110 may include a plurality of conductive bonding pads (not shown) in an upper surface 126 of the package substrate 110. A plurality of metal bumps 124, such as C4 solder bumps, may electrically connect conductive bonding pads (not shown) on the bottom surface of the interposer 108 to the conductive bonding pads on the upper surface 126 of the package substrate 110. In various embodiments, the metal bumps 124 may include a suitable solder material, such as tin (Sn), although other suitable solder materials are within the contemplated scope of disclosure.

A second underfill material portion 128 may be provided in the spaces surrounding the metal bumps 124 and between the bottom surface of the interposer 108 and the upper surface 126 of the package substrate 110 as illustrated, for example, in FIG. 1B. In various embodiments, the second underfill material portion 128 may include an epoxy-based material, which may include a composite of resin and filler materials. In some embodiments, a lid or cover (not shown in FIGS. 1A and 1B) may be mounted to the package substrate 110 and may provide an enclosure around the upper and side surfaces of the first semiconductor dies 104 and second semiconductor dies 106.

As described above, the package substrate 110 may be mounted to the support substrate 102, such as a printed circuit board (PCB). Other suitable support substrates 102 are within the contemplated scope of disclosure. The package substrate 110 may include a plurality of conductive bonding pads 130 in a lower surface 114 of the package substrate 110. A plurality of conductive interconnects (not shown) may extend through the package substrate 110 between conductive bonding pads on the upper surface 126 and lower surface 114 of the package substrate 110. The plurality of solder balls (or bump structures) 112 may electrically connect the conductive bonding pads 130 on the lower surface 114 of the package substrate 110 to a plurality of conductive bonding pads 132 on the upper surface 116 of the support substrate 102.

The conductive bonding pads 130 of the package substrate 110 and conductive bonding pads 132 of the support substrate 102 may be formed of a suitable conductive material, such as copper. Other suitable conductive materials are within the contemplated scope of disclosure. The plurality of solder balls 112 on the lower surface 114 of the package substrate 110 may form an array of solder balls 112, such as a ball grid array (BGA) that may include an array pattern that corresponds to an array pattern of the conductive bonding pads 132 on the upper surface 116 of the support substrate 102. In one non-limiting example, the array of solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used.

The solder balls 112 may include any suitable solder material, such as tin, lead, silver, indium, zinc, nickel, bismuth, antimony, cobalt, copper, germanium, alloys thereof, combinations thereof, or the like. Other suitable materials for the solder balls 112 are within the contemplated scope of disclosure.

In some embodiments, the lower surface 114 of the package substrate 110 may include a coating of solder resist (SR) material (not shown), which may also be referred to as a "solder mask". A SR material coating may provide a protective coating for the package substrate 110 and any underlying circuit patterns formed on or within the package substrate 110. An SR material coating may also inhibit solder material from adhering to the lower surface 114 of the package substrate 110 during a reflow process. In embodiments in which the lower surface 114 of the package substrate 110 includes an SR coating, the SR material coating may include a plurality of openings through which the conductive bonding pads 130 may be exposed.

In various embodiments, each of the conductive bonding pads 130 in different regions of the package substrate 110 may have the same size and shape. In the embodiment shown in FIGS. 1A and 1B, the surfaces of the conductive bonding pads 130 may be substantially co-planar with the lower surface 114 of the package substrate 110, which in some embodiments may include a solder resist (SR) coating. Alternatively, the surfaces of the conductive bonding pads 130 may be recessed relative to the lower surface 114 of the package substrate 110. In some embodiments, the surfaces of the conductive bonding pads 130 may be raised relative to the lower surface 114 of the package substrate 110.

Referring again to FIGS. 1A and 1B, solder balls 112 may be provided over the respective conductive bonding pads 130. In one non-limiting example, the conductive bonding pads 130 may have a width dimension that is between about 500 μm and about 550 μm (e.g., ~530 μm), and the solder balls 112 may have an outer diameter that may be between about 600 μm and about 650 μm (e.g., ~630 μm), although greater and lesser dimensions for the solder balls 112 and/or the conductive bonding pads 130 are within the contemplated scope of disclosure.

A first solder reflow process may include subjecting the package substrate 110 to an elevated temperature (e.g., at least about 250° C.) in order to melt the solder balls 112 and cause the solder balls 112 to adhere to the conductive bonding pads 130. Following the first reflow process, the package substrate 110 may be cooled causing the solder balls 112 to re-solidify. Following the first solder reflow process, the solder balls 112 may adhere to the conductive bonding pads 130. Each solder ball 112 may extend from the lower surface 114 of the package substrate 110 by a vertical height that may be less than the outer diameter of the solder ball 112 prior to the first reflow process. For example, where the outer diameter of the solder ball 112 is between about 600 μm and about 650 μm (e.g., ~630 μm), the vertical height of the solder ball 112 following the first reflow process may be between about 500 μm and about 550 μm (e.g., ~520 μm).

In various embodiments, the process of mounting the package substrate 110 onto the support substrate 102 as shown in FIG. 1B, may include aligning the package substrate 110 over the support substrate 102, such that the solder balls 112 contacting the conductive bonding pads 130 of the package substrate 110 may be located over corresponding bonding pads (e.g., conductive bonding pads 132) on the support substrate 102. A second solder reflow process may then be performed. The second solder reflow process may include subjecting the package substrate 110 to an elevated temperature (e.g., at least about 250° C.) to thereby melt the solder balls 112 and cause the solder balls 112 to adhere to the corresponding conductive bonding pads 132 on the support substrate 102. Surface tension may cause the semi-liquid solder to maintain the package substrate 110 in alignment with the support substrate 102 while the solder material cools and solidifies. Upon solidification of the solder balls 112, the package substrate 110 may sit above the upper surface 116 of the support substrate 102 by a stand-off height that may be between about 0.4 mm to about 0.5 mm, although greater or lesser stand-of heights are within the contemplated scope of disclosure.

Following the mounting of the package substrate 110 to the support substrate 102, a third underfill material portion 134 may be provided in the spaces surrounding the solder balls 112 and between the lower surface 114 of the package substrate 110 and the upper surface 116 of the support substrate 102, as is shown in FIG. 1B. In various embodiments, the third underfill material portion 134 may include an epoxy-based material, which may include a composite of resin and filler materials.

Figure 2A:
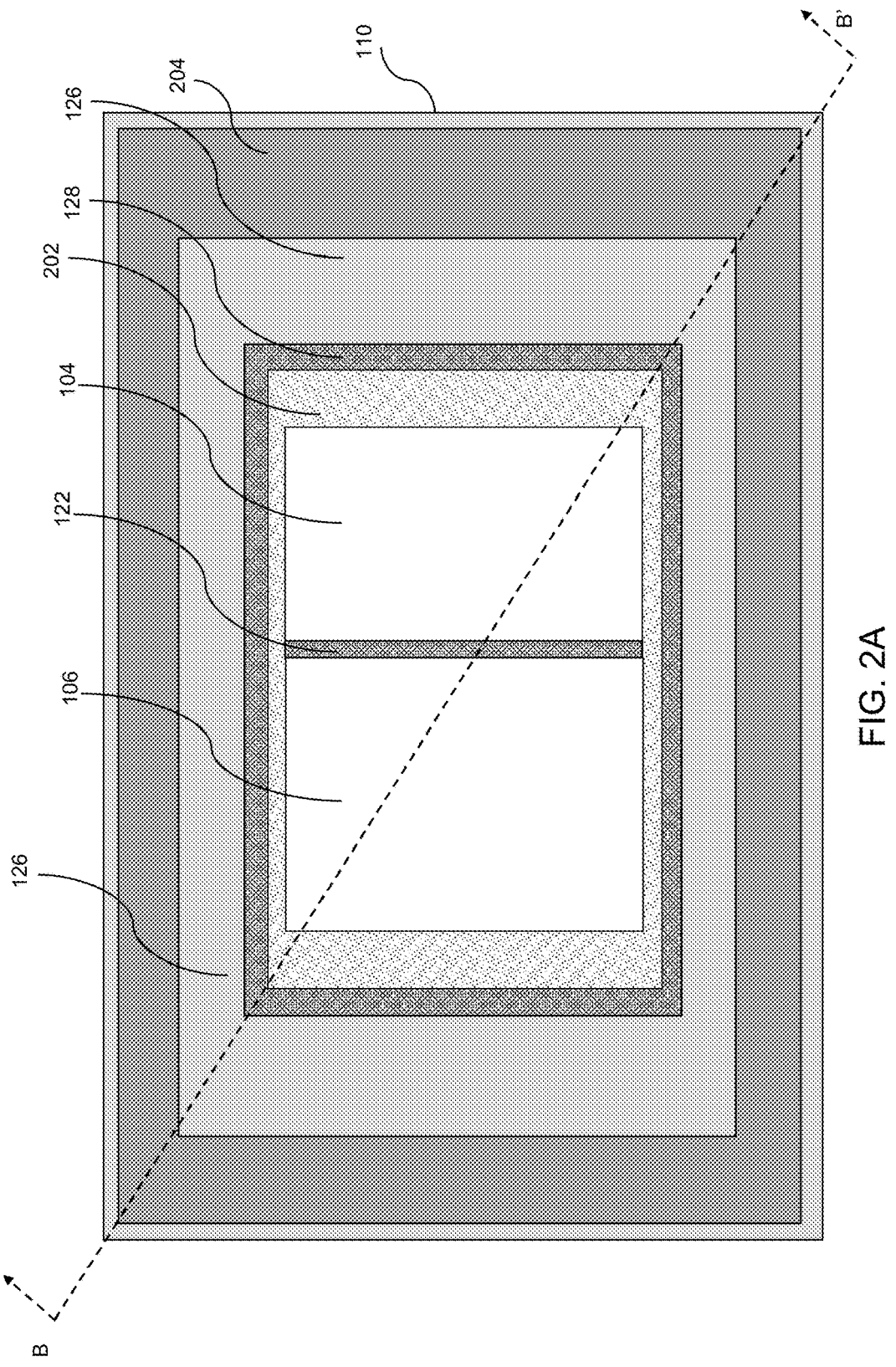
FIG. 2A is a top view of a semiconductor package including an external reinforcement structure.

FIG. 2A is a top view of a semiconductor package 200 including an external reinforcement structure 204, which may be provided to reduce or eliminate the warpage distortion of the package substrate 110 shown in FIG. 1B. The dashed line labeled B-B' indicates the cross-sectional view of the semiconductor package 200 shown in FIG. 2B, as described in greater detail, below. The semiconductor package 200 may be similar to the semiconductor package 100 of FIGS. 1A and 1B. In this regard, the semiconductor package 200 may include a first semiconductor die 104 and a second semiconductor die 106 mounted to an interposer 108 (e.g., see FIG. 2B). The interposer 108 may be mounted to a package substrate 110, as described above with reference to FIGS. 1A and 1B. The semiconductor package 200 may include a first underfill material portion 122 provided in the spaces laterally separating the adjacent first semiconductor die 104 and second semiconductor die 106 of the semiconductor package 200. The semiconductor package 200 may also include a second underfill material portion 128 may be provided in the spaces surrounding the metal bumps 124 and between the bottom surface of the interposer 108 and the upper surface 126 of the package substrate 110 as illustrated, for example, in FIG. 2B.

The semiconductor package 200 may further include an epoxy molding compound (EMC) that may be applied to gaps formed between the interposer 108, the first semiconductor die 104, and the second semiconductor die 106, to thereby form a multi-die EMC frame 202. The EMC material may include an epoxy-containing compound that may be hardened (i.e., cured) to provide a dielectric material portion having sufficient stiffness and mechanical strength. The EMC material may include epoxy resin, hardener, silica (as a filler material), and other additives. The EMC material may be provided in a liquid form or in a solid form depending on the viscosity and flowability.

Liquid EMC may provide better handling, good flowability, fewer voids, better fill, and fewer flow marks. Solid EMC may provide less cure shrinkage, better stand-off, and less die drift. A high filler content (such as 85% in weight) within an EMC material may shorten the time in mold, lower the mold shrinkage, and reduce the mold warpage. A uniform filler size distribution in the EMC material may reduce flow marks, and may enhance flowability. The curing temperature of the EMC material may be in a range from 125° C. to 150° C. The multi-die EMC frame 202 may be cured at a curing temperature to form an EMC matrix that laterally encloses each of the first semiconductor die 104 and the second semiconductor die 106. Excess portions of the multi-die EMC frame 202 may be removed from above the horizontal plane including the top surfaces of the semiconductor dies (104, 106) by a planarization process, such as CMP.

Figure 2B:
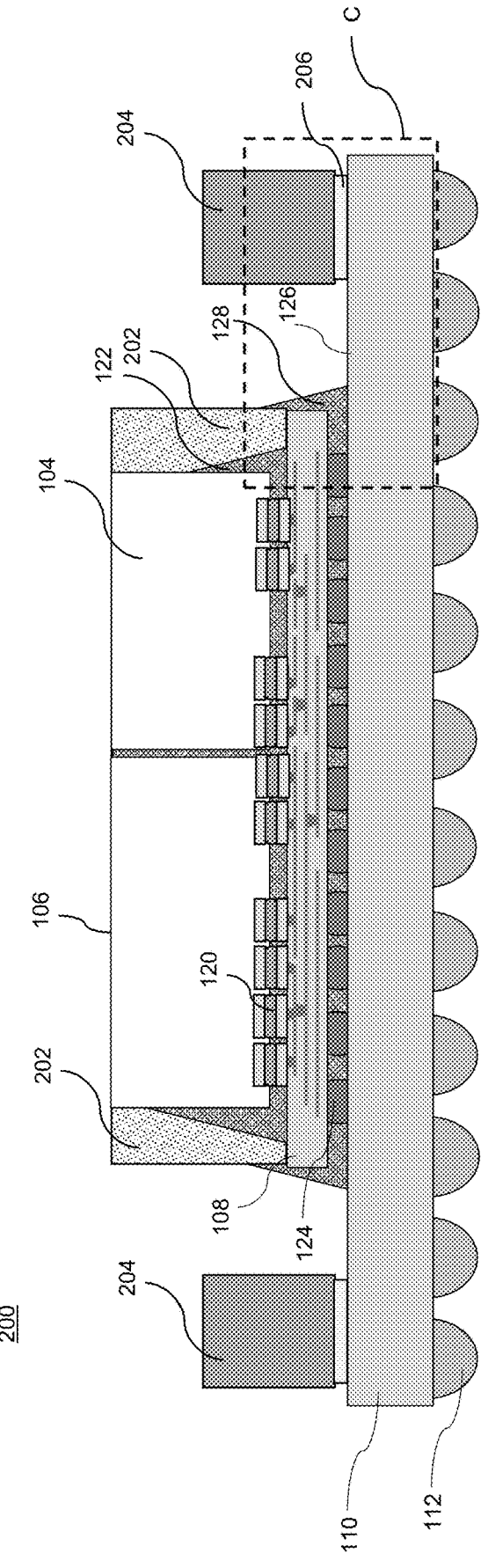
FIG. 2B is a vertical cross-sectional view of the semiconductor package of FIG. 2A with the cross-section indicated by the line BB' in FIG. 2A.

FIG. 2B is a cross-sectional view of the semiconductor package 200 of FIG. 2A. The external reinforcement structure 204 may be attached to the package substrate 110 with an adhesive 206 and may be formed of a metal, an insulator, a semiconductor, a ceramic, etc. For example, in one embodiment, the external reinforcement structure 204 may include copper at an atomic percentage greater than 80%, such as greater than 90% and/or greater than 95% although greater or lesser percentages may be used. As shown in FIG. 2A, the external reinforcement structure 204 may be configured as a ring located around a periphery of the package substrate 110. As such, the external reinforcement structure 204 may form a single structure. Alternatively, the external reinforcement structure 204 may include several disconnected portions (not shown). Further, the external reinforcement structure 204 need not be located near the periphery of the package substrate 110. Rather, the external reinforcement structure 204 may located on the package substrate 110 in any region that may be subject to mechanical distortions such as warping.

The external reinforcement structure 204 may provide increased mechanical support to the package substrate 110 to thereby reduce or eliminate mechanical distortions such as the warping of the package substrate 110 described above and illustrated, for example, in FIG. 1B. The external reinforcement structure 204 may therefore be chosen to have a mechanical strength (e.g., modulus) that is greater than that of the package substrate 110. As described above, the package substrate 110 may include an organic material (e.g., a polymer and/or thermoplastic material), a semiconductor material (e.g., a semiconductor wafer, such as a silicon wafer), a ceramic material, a glass material, combinations thereof, etc. As such, the choice of material for the external reinforcement structure 204 may be chosen based on the mechanical properties of the package substrate 110. As shown in FIG. 2B, for example, the presence of the external reinforcement structure 204 may reduce or eliminate the warpage distortion of the package substrate 110 shown in FIG. 1B. However, the presence of the external reinforcement structure 204 may give rise to other mechanical issues as described in greater detail with reference to FIG. 2C, below.

Figure 2C:
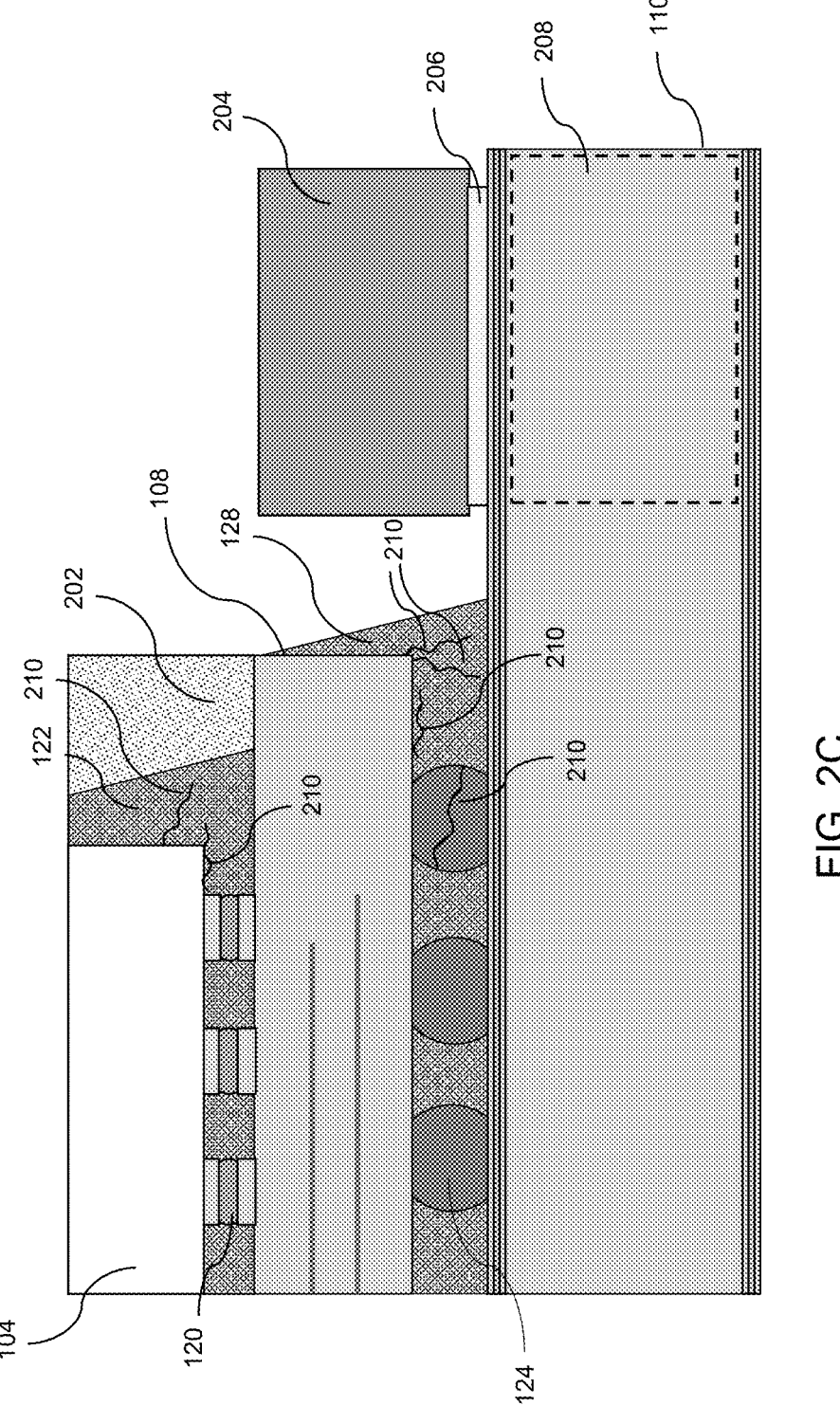
FIG. 2C is a vertical cross-sectional view of an enlarged portion of the semiconductor package of FIG. 2B.

FIG. 2C is a cross-sectional view of an enlarged portion of the semiconductor package of FIG. 2B. The region shown in FIG. 2C is illustrated in the dashed rectangle labeled C in FIG. 2B. For certain material compositions, there may be a mismatch in thermal expansion coefficients of components of the semiconductor package 200 relative to a thermal expansion coefficient of the external reinforcement structure 204. As such, thermal expansion stresses may develop during thermal cycling. Such thermal stresses may lead to mechanical degradation of the semiconductor package 200. For example, as shown in FIG. 2C, cracks 210 may develop in the first underfill material portion 122, in the second underfill material portion 128, at interfaces, within the metal bumps 124, etc. Further, one or both of the first underfill material portion 122 and the second underfill material portion 128 may become delaminated (not shown) from the package substrate 110 and/or from the interposer 108. In various disclosed embodiments, one or more additional reinforcement structures (e.g., see reinforcement structures 212, 401, 403 in FIGS. 3A to 4, respectively) may be provided to compensate the thermal stresses developed between components of the semiconductor package 200 and the external reinforcement structure 204. For example, a package reinforcement structure 212 may be formed within the package substrate 110 (e.g., within region 208 in FIG. 2C), as described in greater detail with reference to FIG. 3A, below.

Figure 3A:
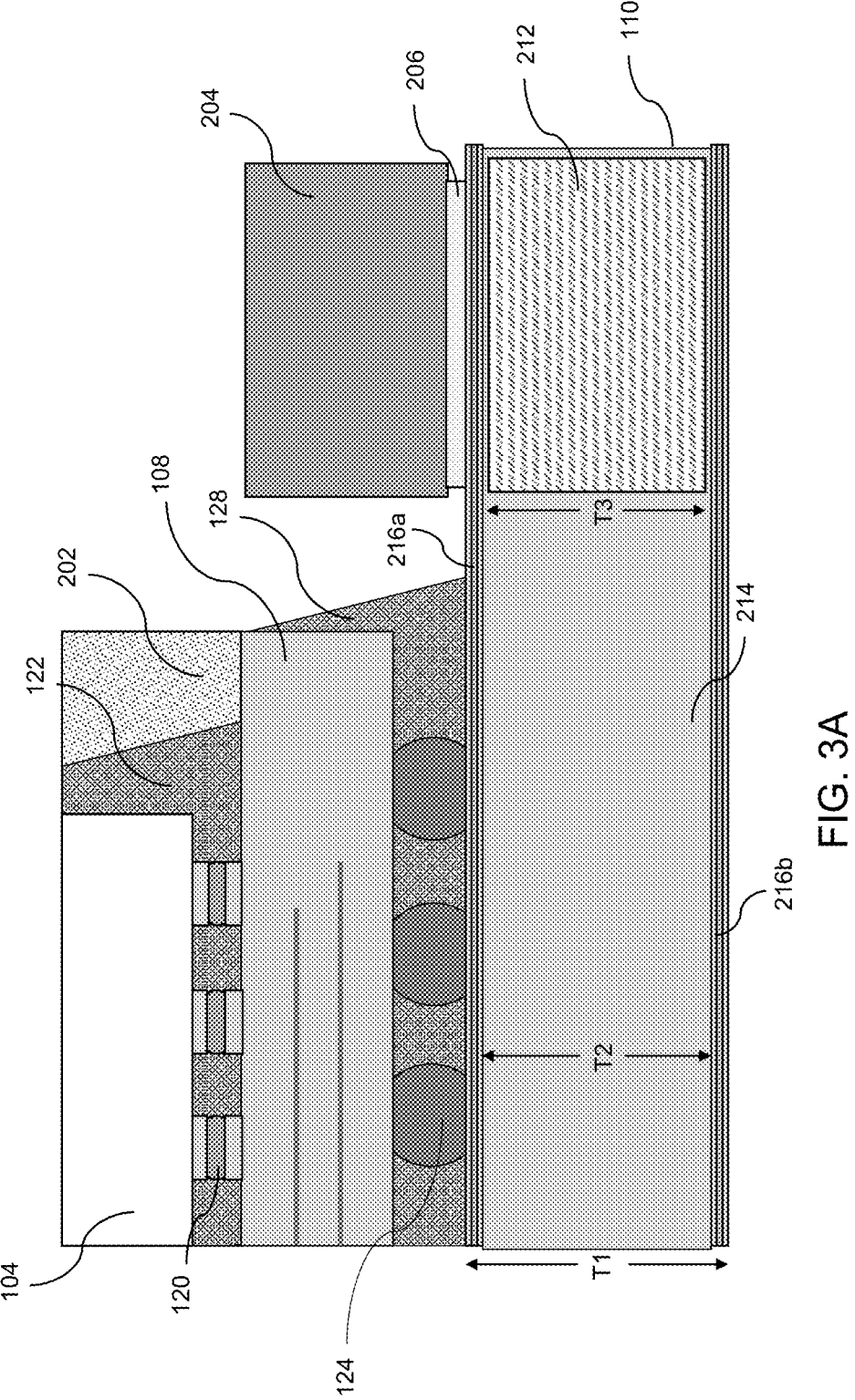
FIG. 3A is a vertical cross-sectional view of an enlarged portion of a semiconductor package having a package reinforcement structure, according to various embodiments.
Figure 3B:
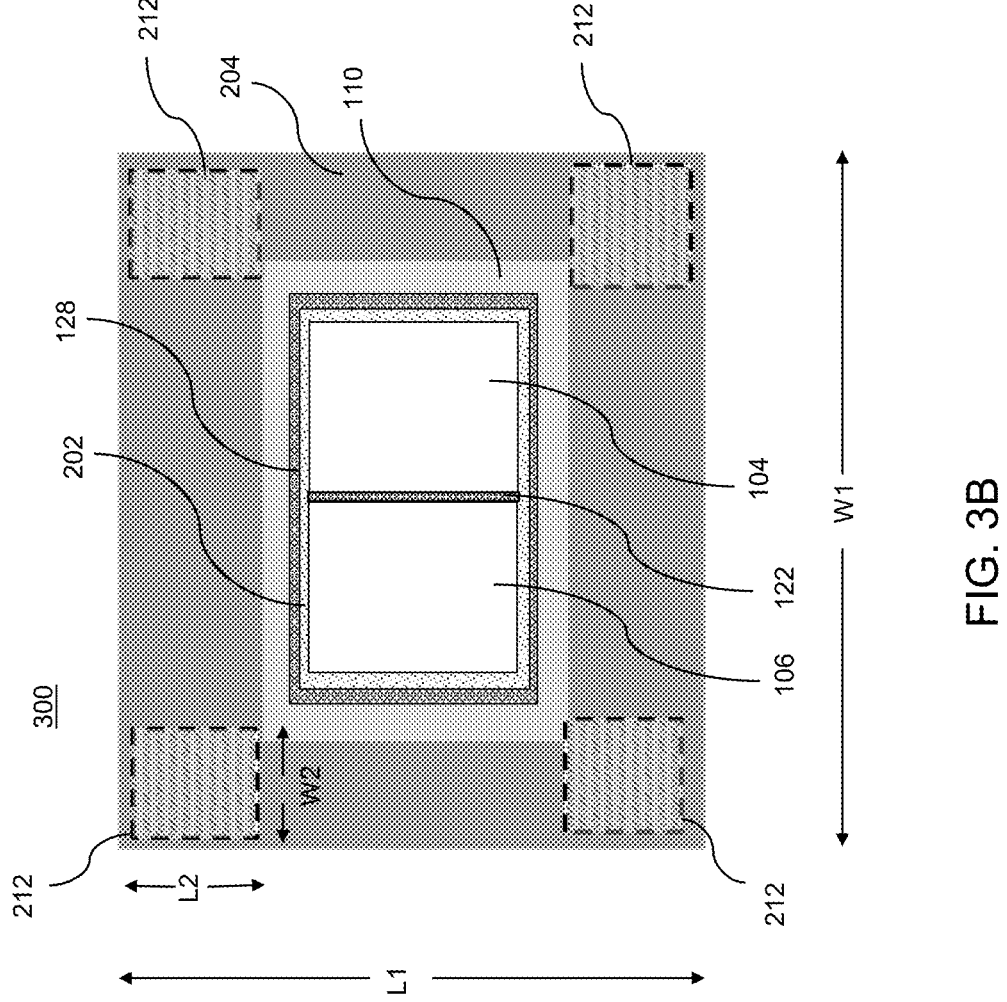
FIG. 3B is a top view of the semiconductor package of FIG. 3A, according to various embodiments.

FIG. 3A is vertical cross-sectional view of an enlarged portion of a semiconductor package 300 having a package reinforcement structure 212, and FIG. 3B is a top view of the semiconductor package 300 of FIG. 3A, according to various embodiments. The package reinforcement structure 212 may be formed within the package substrate 110 and may be configured to mitigate against various stresses caused by a mismatch in the thermal expansion coefficients of the external reinforcement structure 204 and other components of the semiconductor package 300, as described in greater detail, below.

The semiconductor package 300 may be similar to the semiconductor package 100 of FIGS. 1A and 1B and the semiconductor package 200 of FIGS. 2A to 2C. In this regard, the semiconductor package 300 may include a first semiconductor die 104 (e.g., see FIG. 3B) and a second semiconductor die 106 mounted to an interposer 108 (e.g., see FIG. 3A). The interposer 108 may be mounted to a package substrate 110, as described above with reference to FIGS. 1A to 2B. Alternatively, in some embodiments, the first semiconductor die 104 and the second semiconductor die 106 may be mounted directly to the package substrate 110 without the interposer 108. The semiconductor package 300 may include a first underfill material portion 122 provided in the spaces laterally separating the adjacent first semiconductor die 104 and second semiconductor dies 106 of the semiconductor package 300. The semiconductor package 300 may also include a second underfill material portion 128 may be provided in the spaces surrounding the metal bumps 124 (e.g., see FIG. 3A) and between the bottom surface of the interposer 108 and the top surface of the package substrate 110 as illustrated, for example, in FIGS. 3A and 3B.

The semiconductor package 300 may further include an EMC material that may be applied to gaps formed between the interposer 108, the first semiconductor die 104, and the second semiconductor die 106, to thereby form a multi-die EMC frame 202. The semiconductor package 300 may also include an external reinforcement structure 204 that may be attached to the package substrate 110 with an adhesive 206. As shown in FIG. 3B, the external reinforcement structure 204 may be configured as a ring structure located around a peripheral region of the semiconductor package 300 and may include a metal, insulator, semiconductor, ceramic material, etc. As such, the external reinforcement structure 204 may form a single connected structure.

As described above, however, the external reinforcement structure 204 may have other configurations in other embodiments. For example, the external reinforcement structure 204 may several disconnected portions (not shown). Further, the external reinforcement structure 204 need not be located near the periphery of the package substrate 110. Rather, the external reinforcement structure 204 may located on the package substrate 110 in any region that may be subject to mechanical distortions such as warping.

The package reinforcement structure 212 may be formed within the package substrate 110 as shown, for example, in FIG. 3A. In this regard, the package substrate 110 may include a core portion 214 including a first material having a first modulus and a first coefficient of thermal expansion. For example, the core portion 214 may include a suitable material, such as an organic material (e.g., a polymer and/or thermoplastic material), a semiconductor material (e.g., a semiconductor wafer, such as a silicon wafer), a ceramic material, a glass material, combinations thereof, etc. Other suitable substrate materials are within the contemplated scope of present disclosure.

The package substrate 110 may further include the package reinforcement structure 212 that may include a second material having a second modulus and a second coefficient of thermal expansion. The materials forming the core portion 214 and the package reinforcement structure 212 may be chosen such that the second modulus is greater than the first modulus and the second coefficient of thermal expansion is less than the first coefficient of thermal expansion. In this regard, the package reinforcement structure 212 may be mechanically stronger and less susceptible to thermal expansion than the core portion 214. As such, the package reinforcement structure 212 may mitigate undesirable mechanical effects (e.g., warpage, cracking, delamination, etc.) that may otherwise be caused by the external reinforcement structure 204.

According to an embodiment, the core portion 214 may include a fiber-reinforced polymer material, and the package reinforcement structure 212 may include silicon, silicon nitride, or a ceramic material. Various other materials that may be used for the core portion 214 and the package reinforcement structure 212 are within the contemplated scope of this disclosure. The modulus of the package reinforcement structure 212 may be chosen to be greater than 100 GPa. Further, the coefficient of thermal expansion of the package reinforcement structure 212 may be less than 10 ppm/C.

As shown in FIG. 3B, the package substrate 110 may have a rectangular geometry and the package reinforcement structure 212 may include a plurality of separate components. In this example embodiment, the package reinforcement structure 212 includes rectangular portions located near each of the four corners of the package substrate 110. In other embodiments, the package reinforcement structure 212 may have various other shapes and may be placed in various other locations within the package substrate 110. The package substrate 110 may have a package length L1 and a package width W1. Similarly, each of the components of the package reinforcement structure 212 may have a reinforcement length L2 and a reinforcement width W2. Each of the package length L1 and the package width W1 may be greater than 20 mm and less than approximately 110 mm, although longer or shorter package lengths L1 and the package widths W1 may be implemented. The reinforcement length L2 may be in a range from approximately 1 mm to half the package length L1 (i.e., may satisfy 1 mm$\leq$L2$\leq$L1/2) and the reinforcement width W2 may be in a range from approximately 1 mm to half the package width W1 (i.e., may satisfy 1 mm$\leq$W2$\leq$W1/2).

As shown in FIG. 3A, the package substrate 110 may further include one or more electrical interconnect layers 216. An upper electrical interconnect layer 216a may be configured to electrically couple the interposer 108 to the package substrate 110 and a lower electrical interconnect layer 216b may be configured to electrically couple the package substrate 110 to the support substrate 102 (e.g., see FIGS. 1A and 1B). The package substrate 110 further may have package thickness T1 that is greater than 300 microns and less than 2,000 microns. The core portion 214 may have a core thickness T2 that is greater than 200 microns and less than 1,600 microns. The package reinforcement structure 212 may include a reinforcement thickness T3 that is less than or equal to the core thickness T2.

Figure 4:
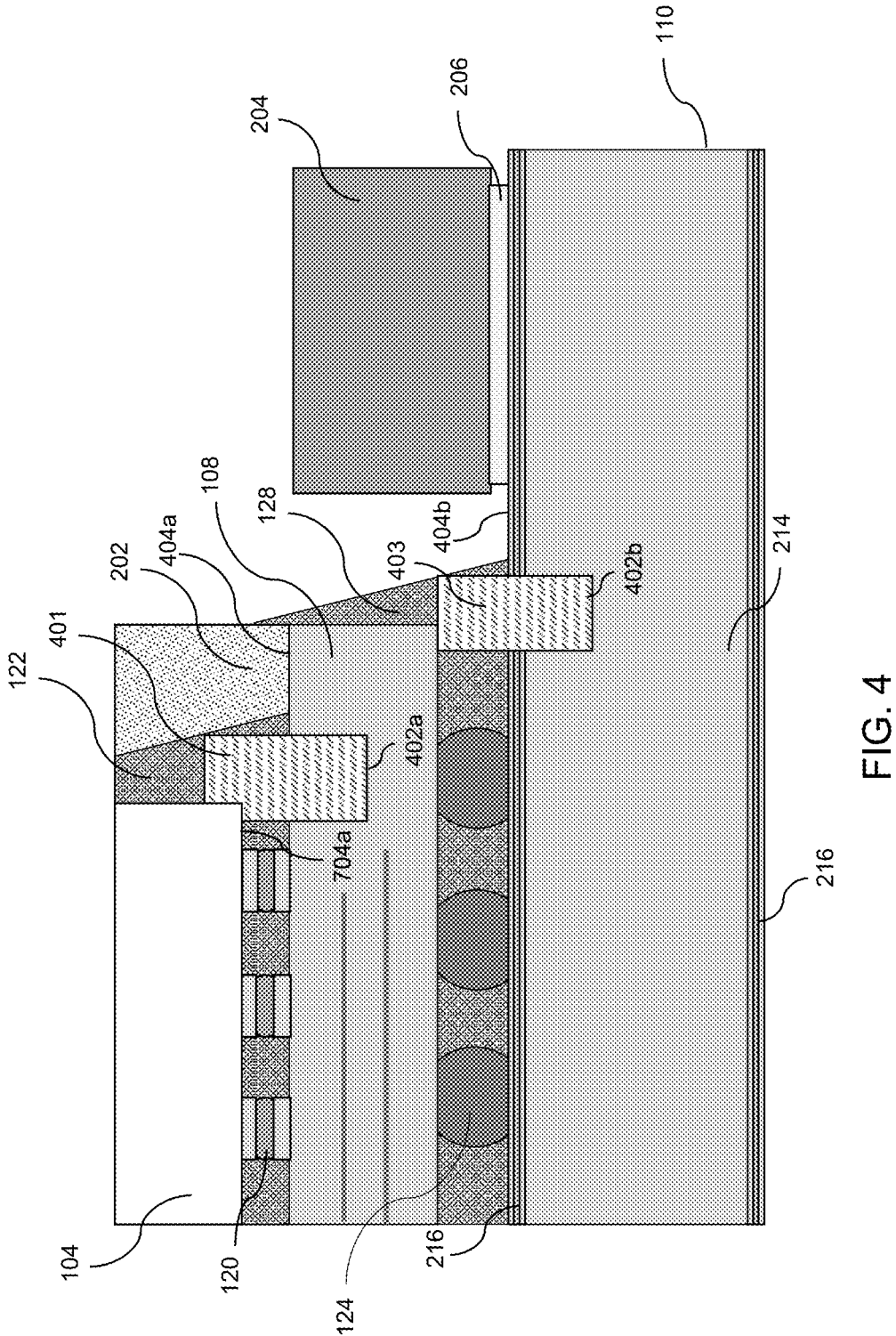
FIG. 4 is a vertical cross-sectional view of an enlarged portion of a further semiconductor package including a die-interposer reinforcement structure and a interposer-substrate reinforcement structure, according to various embodiments.

FIG. 4 is a vertical cross-sectional view of an enlarged portion of a further semiconductor package 400 having a die-interposer reinforcement structure 401 and an inter-poser-substrate reinforcement structure 403, according to various embodiments. The semiconductor package 400 may be similar to the semiconductor packages (100, 200, 300) described above with reference to FIGS. 1A to 3B. In this regard, the semiconductor package 400 may include semiconductor dies (104, 106) mounted to an interposer 108, which may in turn be mounted to a package substrate 110. A first underfill material portion 122 and a multi-die EMC frame 202 may be provided to mechanically strengthen the coupling between the semiconductor dies (104, 106) and the interposer 108. Similarly, a second underfill material portion 128 and an external reinforcement structure 204 may be provided to mechanically strengthen the coupling between the interposer 108 and the package substrate 110.

As described above with reference to FIG. 2C, however, thermally induced mechanical stresses/strains may still induce mechanical deformations (e.g., warpage, cracking, delamination, etc.) without further reinforcement. As such, it may be advantageous to provide additional reinforcement structures (401, 403) in certain portions of the semiconductor package 400 that may otherwise have a high stress/strain concentration. For example, in certain embodiments, a stress/strain distribution may have greatest near the corners of certain components of the semiconductor package 400. Therefore, in the embodiment semiconductor package 400 of FIG. 4, the die-interposer reinforcement structure 401 may be provided to counteract a high stress/strain concentration near a corner of the first semiconductor die 104. Similarly, the interposer-substrate reinforcement structure 403 may be provided to counteract a high stress/strain concentration near a corner of the interposer 108.

Each of the die-interposer reinforcement structure 401 and the interposer-substrate reinforcement structure 403 may include a solid structure having an adhesive strength that may be greater than 5 N/mm2 and less than 10 N/mm2 and a modulus that may be greater than 0.1 GPa and less than 1.0 GPa. For example, each of the die-interposer reinforcement structure 401 and the interposer-substrate reinforcement structure 403 may include an epoxy, acrylic, or an adhesive material. Such materials may be provided in liquid form during the formation of the semiconductor package 400 and may be cured to form the solid die-interposer reinforcement structure 401 and the interposer-substrate reinforcement structure 403, as described in greater detail, below. Various other materials may be used for the die-interposer reinforcement structure 401 and the interposer-substrate reinforcement structure 403 in other embodiments. For example, a solid EMC material may also be used for the die-interposer reinforcement structure 401 and the interposer-substrate reinforcement structure 403.

As shown in FIG. 4, the die-interposer reinforcement structure 401 may have a bottom surface 402a formed below a top surface 404a of the interposer 108, and the interposer-substrate reinforcement structure 403 may have a bottom surface 402b formed below a top surface 404b of the package substrate 110. In this regard, the die-interposer reinforcement structure 401 may be formed by forming cavities (see 902a in FIG. 9C)) in the interposer 108 and filling the cavity with an epoxy, acrylic, or an adhesive material and providing an additional amount of the epoxy, the acrylic, or the adhesive material such that the epoxy, the acrylic, or the adhesive material also contacts a surface (e.g., bottom surface 704*a*) of the first semiconductor die 104, as described in greater detail below. A similar procedure may also be performed to form the interposer-substrate reinforcement structure 403.

Figures 5A, 5B:
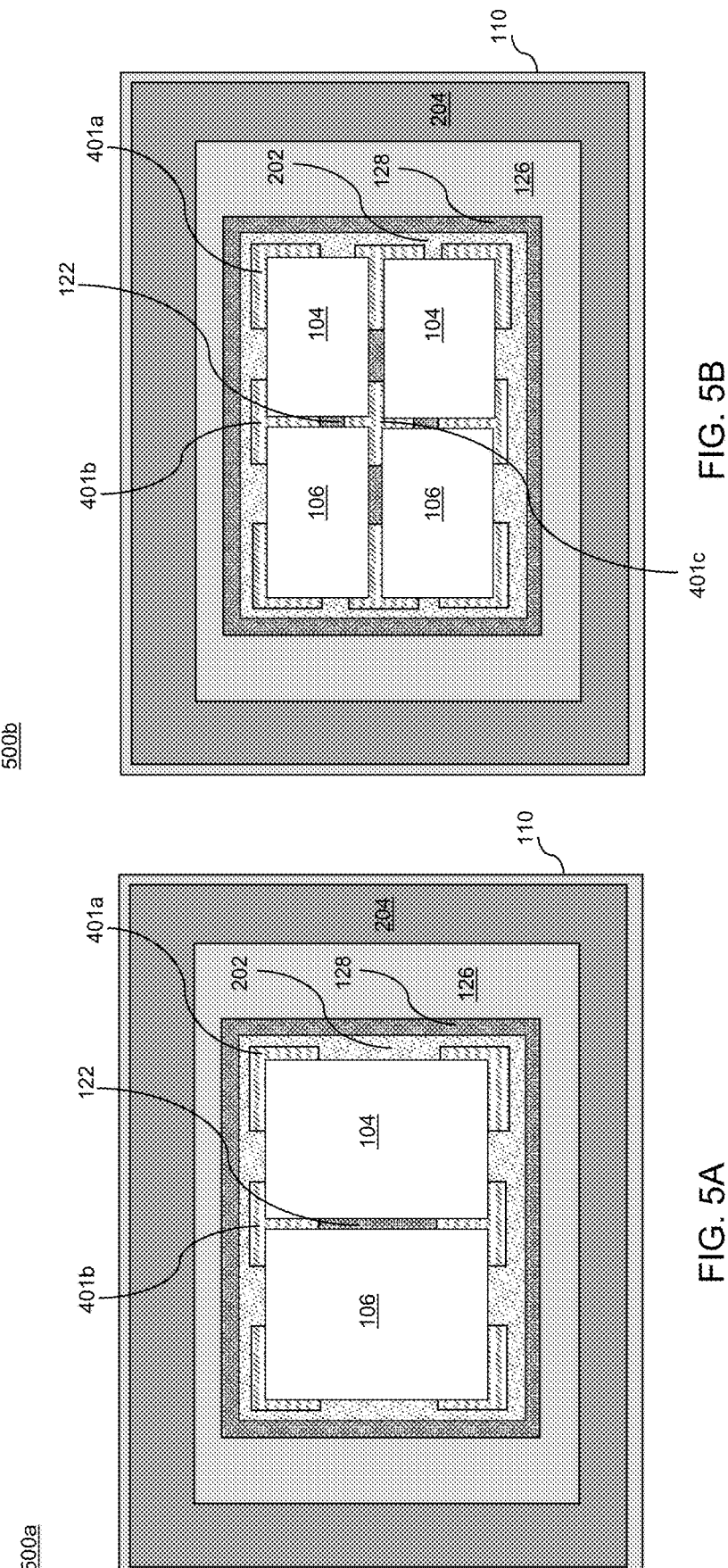
FIG. 5A is a top view of a further semiconductor package including die-interposer reinforcement structures, according to various embodiments.
FIG. 5B is a top view of a further semiconductor package including die-interposer reinforcement structures, according to various embodiments.

FIG. 5A is a top view of a semiconductor package 500*a* including die-interposer reinforcement structures (401*a*, 401*b*), and FIG. 5B is a top view of a further semiconductor package 500*b* including die-interposer reinforcement structures (401*a*, 401*b*, 401*c*), according to various embodiments. Each of the semiconductor packages (500*a*, 500*b*) may be similar to the semiconductor packages (100, 200, 300, 400) described above with reference to FIGS. 1A to 4. For example, the semiconductor package 500*a* of FIG. 5A may include a first semiconductor die 104 and a second semiconductor die 106 attached to an interposer 108 (not shown), which in turn may be attached to a package substrate 110. Similarly, as shown in FIG. 5B, the semiconductor package 500*b* may include two first semiconductor dies 104 and two second semiconductor dies 106 attached to an interposer 108 (not shown), which in turn may be attached to a package substrate 110.

Each of the package structures (500*a*, 500*b*) may include a first underfill material portion 122, a second underfill material portion 128, an EMC die frame 202, and an external reinforcement structure 204. Each of the package structures (500*a*, 500*b*) may also include a plurality of additional die-interposer reinforcement structures (401*a*, 401*b*, 401*c*). For example, a plurality of first die-interposer reinforcement structures 401*a* may be formed at corners of respective semiconductor dies (104, 106), and a plurality of second die-interposer reinforcement structures 401*b* may be formed at edges of respective semiconductor dies (104, 106). As shown, for example in FIG. 5B, in embodiments including three or more semiconductor dies (104, 106) there may be one or more third die-interposer reinforcement structures 401*c* that may be formed at corresponding regions in which three or more corners of the semiconductor dies (104, 106) are proximate to one another.

Figures 6A, 6B, 6C:
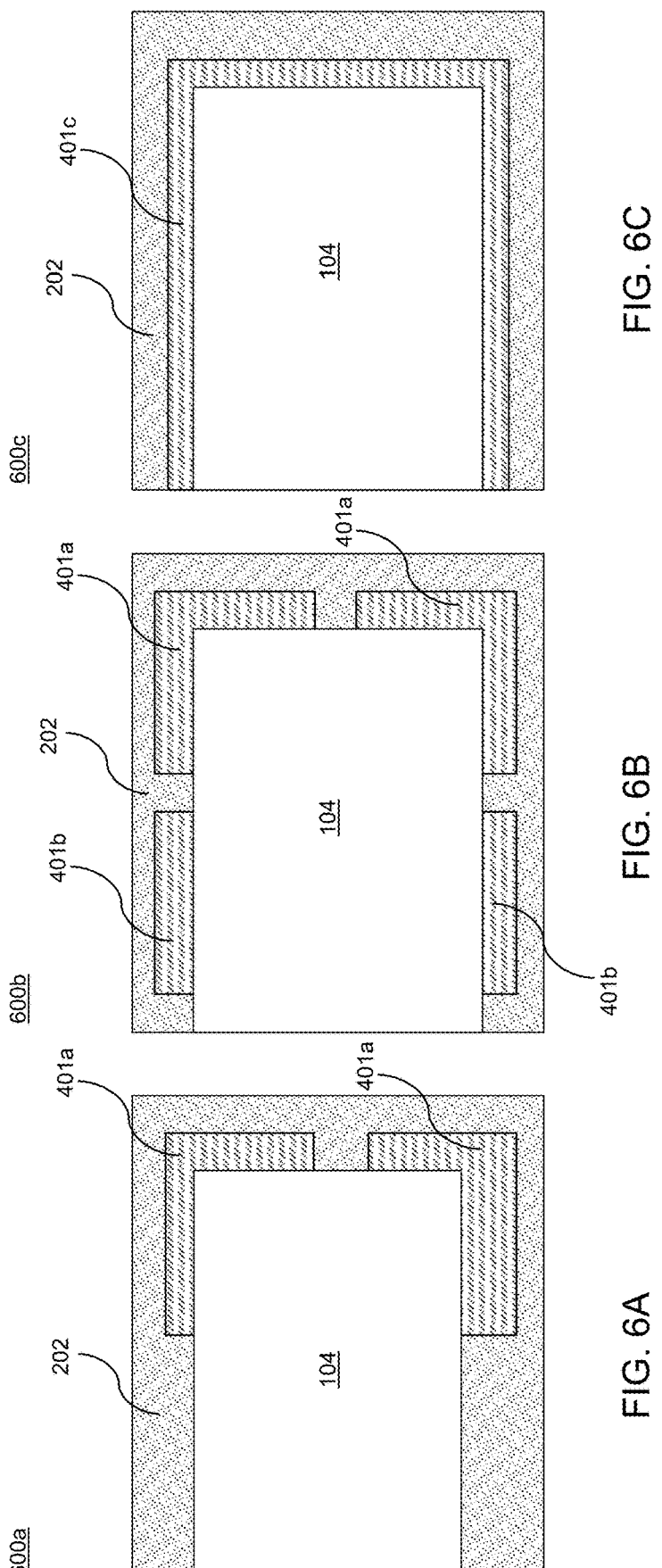
FIG. 6A is a top view of a portion of a further semiconductor package including die-interposer reinforcement structures, according to various embodiments.
FIG. 6B is a top view of a portion of a further semiconductor package including die-interposer reinforcement structures, according to various embodiments.
FIG. 6C is a top view of a portion of a further semiconductor package including die-interposer reinforcement structures, according to various embodiments.

FIGS. 6A to 6C are top views of portions of respective semiconductor packages (600*a*, 600*b*, 600*c*) with die-interposer reinforcement structures (401*a*, 401*b*, 401*c*), according to various embodiments. In each of the configurations of FIGS. 6A to 6C a first semiconductor die 104 is supported by an EMC die frame 202 and one or more die-interposer reinforcement structures (401*a*, 401*b*, 401*c*). In FIG. 6A, for example, the first semiconductor die 104 is supported by two first die-interposer reinforcement structures 401*a* formed at respective corners of the first semiconductor die 104. In the semiconductor package 600*b* of FIG. 6B, the first semiconductor die 104 is supported by two first die-interposer reinforcement structures 401*a* formed at respective corners of the first semiconductor die 104 along with two second die-interposer reinforcement structures 401*b* formed along edges of the first semiconductor die 104. In the semiconductor package 600*c* of FIG. 6C, the first semiconductor die 104 is supported by a single third die-interposer reinforcement structure 401*c* that may be formed around a perimeter of the first semiconductor die 104. Each of the die-interposer reinforcement structures (401*a*, 401*b*, 401*c*) may have a first portion 702*a* formed externally to the first semiconductor die 104 and a second portion 702*b* formed under the first semiconductor die 104, as described in greater detail with reference to FIGS. 7A to 8D, below.

FIGS. 7A to 7D are enlarged vertical cross-sectional views of further semiconductor packages (700*a*, 700*b*, 700*c*, 700*d*) each including a die-interposer reinforcement structure 401, according to various embodiments. As shown, each of the semiconductor packages (700*a*, 700*b*, 700*c*, 700*d*) include a first semiconductor die 104 electrically coupled to an interposer 108 and supported by an EMC die frame 202 and a die-interposer reinforcement structure 401. While each of FIGS. 7A-7D illustrate the first semiconductor die 104 electrically coupled to an interposer 108 and supported by an EMC die frame 202, one of ordinary skill in the art may recognize that the die-interposer reinforcement structure 401 may be formed proximate to the second semiconductor die 106 that is electrically coupled to the interposer 108 and supported by the EMC die frame 202. The die-interposer reinforcement structure 401 in each of the semiconductor packages (700*a*, 700*b*, 700*c*, 700*d*) may be formed at a corner and/or along an edge of the respective first semiconductor die 104.

As shown in FIGS. 7A to 7D, the die-interposer reinforcement structure 401 may formed on a top surface 404*a* of the interposer 108 and may partially overlap with the first semiconductor die 104 in a plan view (e.g., see FIG. 8D) such that the die-interposer reinforcement structure 401 includes a first portion 702*a* (e.g., see FIGS. 7A, 7B, and 7D) that extends laterally to a region external to the first semiconductor die 104 such as to be non-overlapping with the first semiconductor die 104 in the plan view. The die-interposer reinforcement structure 401 may further include a second portion 702*b* (e.g., see FIGS. 7A, 7B, 7C) of the die-interposer reinforcement structure 401 that is formed in a space between the top surface 404*a* of the interposer 108 and a bottom surface 704*a* of the first semiconductor die 104 such that the second portion 702*b* is overlapping with the first semiconductor die 104 in the plan view (e.g., see FIG. 8D).

Figures 7A, 7B, 7C, 7D:
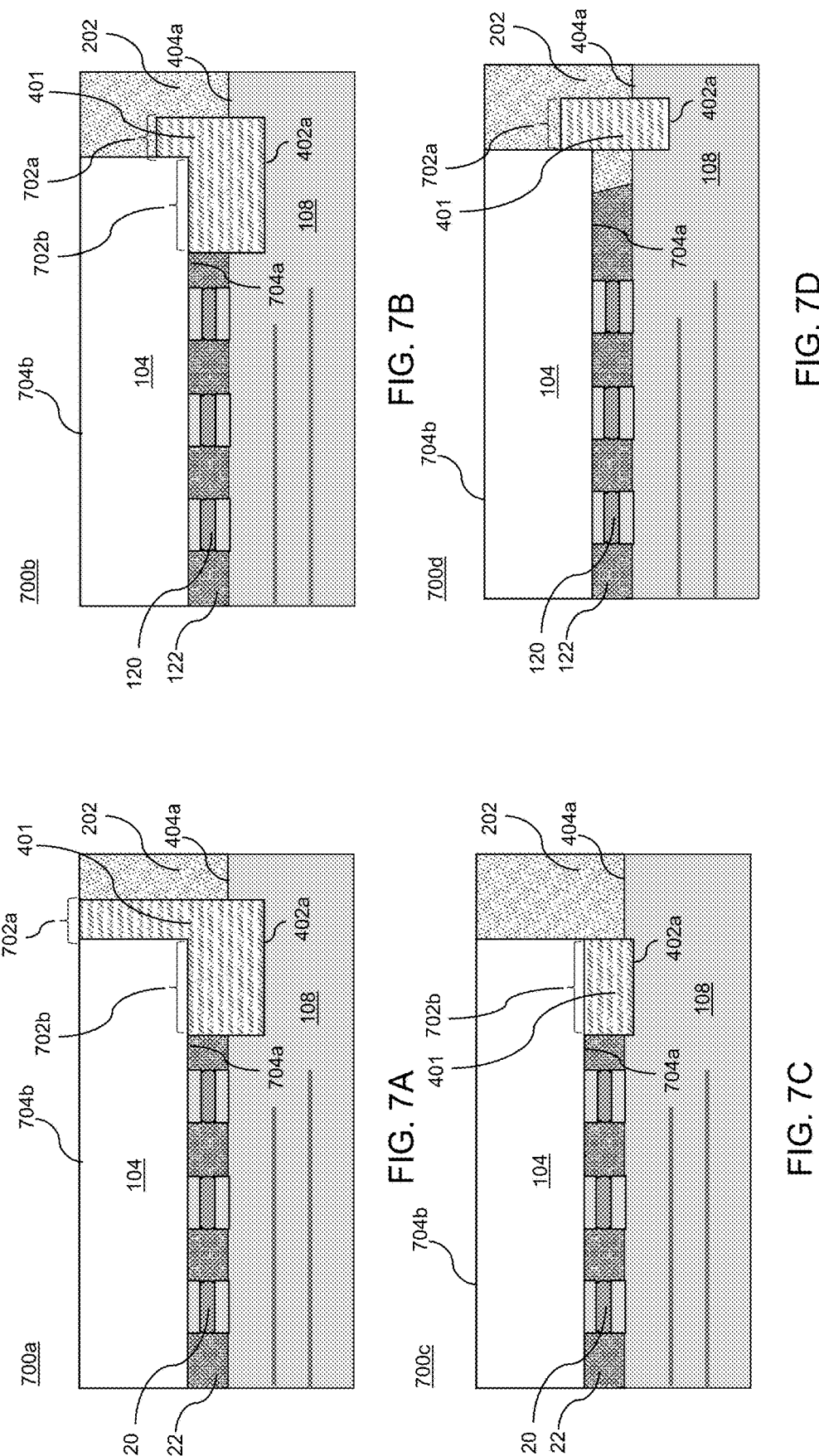
FIG. 7A is a vertical cross-sectional view of an enlarged portion of a further semiconductor package including a die-interposer reinforcement structure in a first configuration, according to various embodiments.
FIG. 7B is a vertical cross-sectional view of an enlarged portion of a further semiconductor package including a die-interposer reinforcement structure in a second configuration, according to various embodiments.
FIG. 7C is a vertical cross-sectional view of an enlarged portion of a further semiconductor package including a die-interposer reinforcement structure in a third configuration, according to various embodiments.
FIG. 7D is a vertical cross-sectional view of an enlarged portion of a further semiconductor package including a die-interposer reinforcement structure in a fourth configuration, according to various embodiments.

As shown in FIG. 7D, in some embodiments, the die-interposer reinforcement structure 401 may include only the first portion 702*a* that extends laterally to a region external to the first semiconductor die 104 such as to be non-overlapping with the first semiconductor die 104 in the plan view. In other embodiments, such as shown in FIG. 7C, the die-interposer reinforcement structure 401 may only include the second portion 702*b* that is formed in a space between the top surface 404*a* of the interposer 108 and the bottom surface 704*a* of the first semiconductor die 104. As shown in FIG. 7A, in some embodiments, the first portion 702*a* may extend from the bottom surface 704*a* of the first semiconductor die 104 to a top surface 704*b* of the first semiconductor die 104. In other embodiments, such as shown in FIGS. 7B and 7D, the first portion 702*a* may extend to a distance that lies between the bottom surface 704*a* and the top surface 704*b* of the first semiconductor die 104.

Figures 8A, 8B, 8C, 8D:
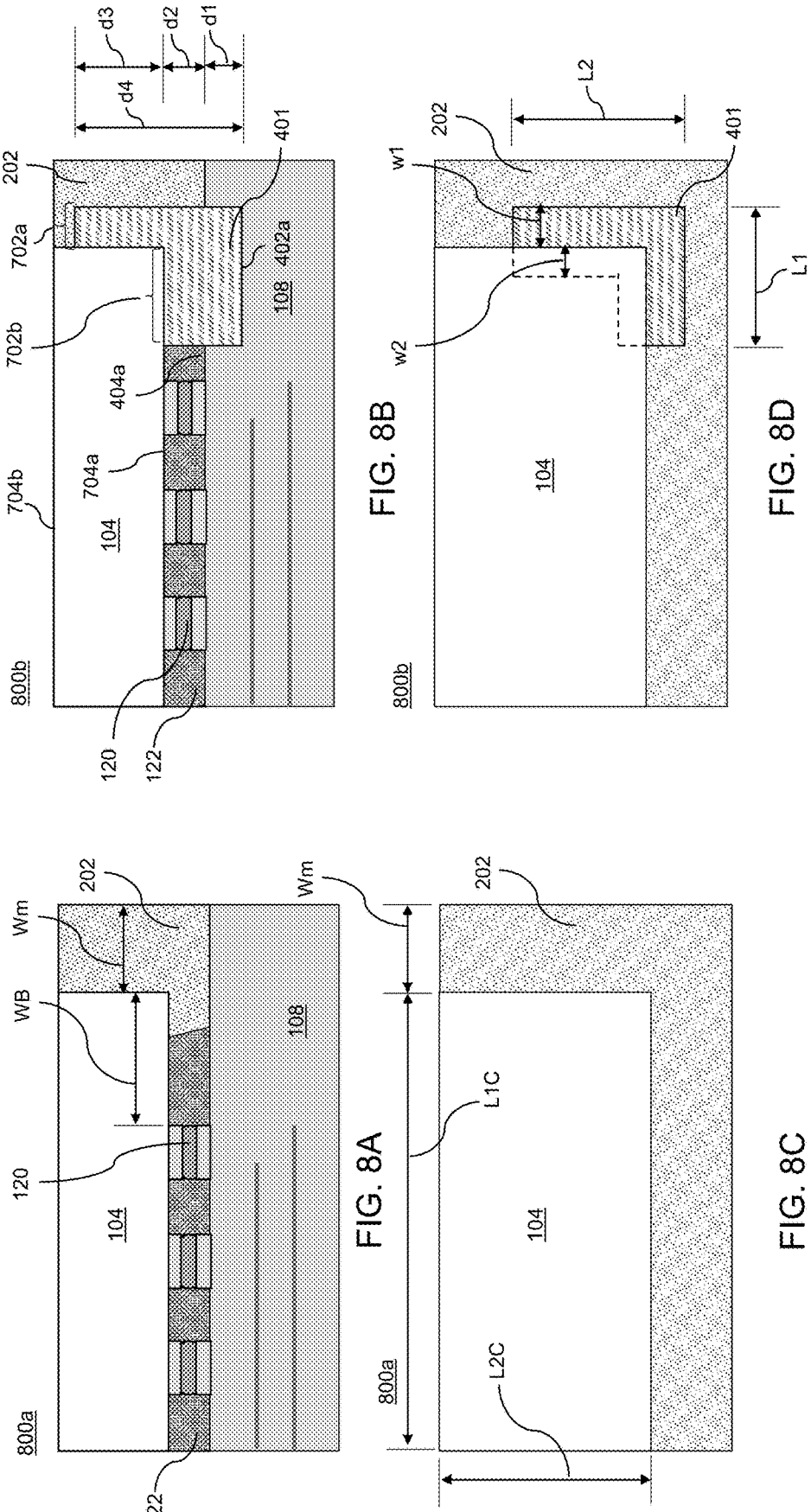
FIG. 8A is a vertical cross-sectional view of an enlarged portion of a further semiconductor package that does not include a die-interposer reinforcement structure, according to various embodiments.
FIG. 8B is a vertical cross-sectional view of an enlarged portion of a further semiconductor package including a die-interposer reinforcement structure, according to various embodiments.
FIG. 8C is a top view of the semiconductor package of FIG. 8A, according to various embodiments.
FIG. 8D is a top view of the semiconductor package of FIG. 8B, according to various embodiments.

FIG. 8A is a vertical cross-sectional view of an enlarged portion of a further semiconductor package 800*a* that does not include a reinforcement structure, and FIG. 8B is a vertical cross-sectional view of an enlarged portion of a further semiconductor package 800*b* that includes a die-interposer reinforcement structure 401, according to various embodiments. FIG. 8C is a top view (i.e., a plan view) of the semiconductor package of FIG. 8A, and FIG. 8D is a top view of the semiconductor package of FIG. 8B, according to various embodiments. As shown in FIGS. 8B and 8D, the first portion 702*a* of the die-interposer reinforcement structure 401 may be formed in a first region between an edge of the first semiconductor die 104 and an edge of the EMC die frame 202. This first region may have a width Wm as shown in FIGS. 8A and 8C, where the die-interposer reinforcement structure 401 has been omitted for clarity. As such, the first portion 702*a* of the die-interposer reinforcement structure

401 may have a width w1 (e.g., see FIG. 8D) that is greater than 0 but is less than the width Wm (i.e., 0<w1<Wm). In certain embodiments, the width w1 of the first portion 702*a* may be greater than 10 microns, but less than 3 mm (i.e., 10 microns<w1<3 mm).

Similarly, as shown in FIGS. 8B and 8D, the second portion 702*b* of the die-interposer reinforcement structure 401 may be formed in a second region between the edge of the first semiconductor die 104 and a nearest one of the metal bumps 120 that bond the first semiconductor die 104 to the interposer 108. This second region may have a width Wb as shown in FIG. 8A, where the die-interposer reinforcement structure 401 has been omitted for clarity. As such, the second portion 702*b* of the die-interposer reinforcement structure 401 may have a width w2 (e.g., see FIG. 8D) that is greater than 0 but is less than the width Wb (i.e., 0<w2<Wb). In certain embodiments, the width w2 of the second portion 702*b* may be greater than 10 microns, but less than 3 mm (i.e., 10 microns<w2<3 mm).

The first portion 702*a* and the second portion 702*b* of the die-interposer reinforcement structure 401 may have various shapes. FIGS. 8B and 8D illustrate an example embodiment in which the die-interposer reinforcement structure 401 is formed at a corner of the first semiconductor die 104. In this example embodiment, the second portion may have a rectangular shape that may have a first length L1 along a first direction and a second length L2 along a second direction, as shown in FIG. 8D. In some embodiments, the first length L1 may satisfy 10 microns<L1<33 mm and the second length L2 may satisfy 10 microns<L2<33 mm In various other embodiments, the first portion 702*a* and the second portion 702*b* may have other non-rectangular shapes (not shown). In this regard, the rectangular shape of the first portion 702*a* and the second portion 702*b* may be formed by using of a patterned photoresist or other structure to define the rectangular structure. In other embodiments, in which a patterning structure is omitted, the first portion 702*a* and the second portion 702*b* may have various irregular shapes (not shown) such as shapes that may be formed when the material of the die-interposer reinforcement structure 401 (e.g., epoxy, acrylic, or an adhesive material) is allowed to flow freely during a deposition process.

As shown in FIGS. 4, 7A to 7D, and 8B, the die-interposer reinforcement structure 401 may have a bottom surface 402*a* formed below a top surface 404*a* of the interposer 108 at a depth characterized by a first distance d1. According to an embodiment, the first distance d1 may satisfy 0 microns<d1<100 microns. The die-interposer reinforcement structure 401 may further extend above the top surface 404*a* of the interposer 108 to a second distance d2. For example, the second distance d2 may correspond to a separation between the top surface 404*a* of the interposer 108 and the bottom surface 704*a* of the first semiconductor die 104 such that the die-interposer reinforcement structure 401 is in contact with the bottom surface 704*a* of the first semiconductor die 104. In this way, the die-interposer reinforcement structure 401 may be adhered to the interposer 108 and to the first semiconductor die 104 and may thereby mechanically strengthen the connection between the first semiconductor die 104 and the interposer 108. According to an embodiment, the second distance d2 may satisfy 0<d2<770 microns.

As shown in FIG. 8B, the die-interposer reinforcement structure 401 may further extend above the bottom surface 704*a* of the first semiconductor die 104 to a third distance d3. As such, the third distance d3 may characterize the spatial extent of the first portion 702*a* of the die-interposer reinforcement structure 401 above the bottom surface 704*a* of the semiconductor die 104. According to an embodiment, the third distance d3 may satisfy 0<d3<770 microns, and as such, the first portion 702*a* of the die-interposer reinforcement structure 401 may be formed so as to be in contact with a side surface of the first semiconductor die 104. The sum of d2+d3 may characterize the spatial extent of the first portion 702*a* and the second portion 702*b* of the die-interposer reinforcement structure 401 above the top surface 404*a* of the interposer. Similarly, a fourth distance d4=d1+d2+d3 may characterize a total thickness of the die-interposer reinforcement structure 401. In this regard, the fourth distance d4 may characterize a spatial extent of the first portion 702*a* of the die-interposer reinforcement structure 401 above the bottom surface 402*a* of the die-interposer reinforcement structure 401. According to certain embodiments, the fourth distance d4 may satisfy 0<d4<870 microns. In other embodiments (e.g., when the second portion 702*b* makes contact with the second semiconductor die 106) the fourth distance may satisfy d1+d2<d4<870 microns.

FIGS. 9A to 9M are vertical cross-sectional views of respective intermediate structures (900*a* to 900*m*) that may be used in the formation of a semiconductor package that includes a first die-interposer reinforcement structure 401*a* and a second die-interposer reinforcement structure 401*b*, according to various embodiments. The intermediate structure 900*a* of 9A may include an interposer 108 on which a plurality of metal bumps 120 have been formed. The interposer 108 may be an organic interposer or a semiconductor interposer. The interposer 108 may include a plurality of interconnect structures (not shown) embedded within an organic or semiconductor structure, and the plurality of metal bumps 120 may be electrically connected to the electrical interconnect structures. The electrical interconnect structures of the interposer 108 may electrically connect the plurality of metal bumps 120 to corresponding bonding pads (not shown) on a bottom side of the interposer 108. As such, the interposer 108 may be electrically connected to the package substrate 110 (e.g., see FIGS. 1A and 1B) in subsequent processing operations.

The intermediate structure 900*b* of FIG. 9B may be formed from the intermediate structure 900*a* by formation of one or more cavities (902*a*, 902*b*) in a top surface of the interposer 108. The cavities 902*a*, 902*b* may be formed in various ways in respective embodiments. For example, a laser drilling process may be performed to generate the cavities 902*a*, 902*b*. Alternatively, an etching process may be performed to generate the cavities 902*a*, 902*b*. For example, a patterned photoresist (not shown) may be formed over a surface of the intermediate structure 900*a* and exposed portions of the intermediate structure 900*a* may be subjected to an anisotropic etching process to generate the cavities 902*a*, 902*b*. The patterned photoresist may then be removed by ashing or by dissolution with a solvent.

The intermediate structure 900*c* of FIG. 9C may be formed from the intermediate structure 900*b* of FIG. 9B by attaching a first semiconductor die 104 and a second semiconductor die 106 to the interposer 108. In this regard, bonding pads (not shown) of the first semiconductor die 104 and the second semiconductor die 106 may be aligned with respective metal bumps 120 of the interposer 108. A reflow operation may then be performed to melt solder material portions on the metal bumps 120. Upon cooling, the solder material portions may solidify and may thereby form electrical and mechanical connections between the bonding pads of the semiconductor dies (104, 106) and the plurality of metal bumps 120.

The intermediate structure 900d of FIG. 9D may be formed from the intermediate structure 900c by formation of the first die-interposer reinforcement structure 401a and the second die-interposer reinforcement structure 401b. As described above, the first die-interposer reinforcement structure 401a and the second die-interposer reinforcement structure 401b may be formed by filling the cavities 902a, 902b, respectively, with an epoxy, acrylic, or an adhesive material. The epoxy, acrylic, or an adhesive material may be provided in a liquid form that may then be cured (optionally at an elevated temperature depending on the material) to thereby form respective solid support structures. The process of filing the cavities 902a, 902b may further include providing an additional amount of the epoxy, the acrylic, or the adhesive material such that the epoxy, the acrylic, or the adhesive material also contacts respective surfaces of the first semiconductor die 104 and the second semiconductor die 106.

As shown in FIG. 9D, the first die-interposer reinforcement structure 401a and the second die-interposer reinforcement structure 401b may be formed to have a rectangular shape. In this regard, the epoxy, acrylic, or an adhesive material may be spatially constrained during the deposition and curing process to thereby form the rectangular shape. For example, a constraining volume may be provided by a patterned photoresist (not shown) or other structure. Alternatively, in other embodiments, the first die-interposer reinforcement structure 401a and the second die-interposer reinforcement structure 401b may be spatially unconstrained during the deposition and curing process and may thereby be formed with an irregular shape (not shown).

The intermediate structure 900e of FIG. 9E may be formed from the intermediate structure 900d by formation of a first underfill material portion 122 and a multi-die EMC (epoxy molding compound) frame 202, as described above. The first underfill material portion 122 may be formed in spaces between the semiconductor dies (104, 106), between the semiconductor dies (104, 106) and the interposer, and may surround the solder bonds between the plurality of metal bumps 120 and bonding pads (not shown) of the interposer 108. The multi-die EMC frame 202 may further mechanically support the connections between the semiconductor dies (104, 106) and the interposer 108. As shown in FIG. 9E, the multi-die EMC frame 202 may be formed so as to surround the first die-interposer reinforcement structure 401a and the second die-interposer reinforcement structure 401b and may thereby further strengthen the mechanical connections between the first die-interposer reinforcement structure 401a and the second die-interposer reinforcement structure 401b and the respective first semiconductor die 104 and the second semiconductor die 106

The intermediate structure 900f of FIG. 9F may be formed from the intermediate structure 900e by attaching a carrier substrate 904 to the intermediate structure 900e. As shown in FIG. 9F, the carrier substrate 904 may be attached to surfaces of the first semiconductor die 104 and the second semiconductor die 106. In this regard, the carrier substrate 904 may be attached to surfaces of the first semiconductor die 104 and the second semiconductor die 106 using an adhesive (not shown). The adhesive may be chosen to have a material composition that allows de-activation by application of heat or ultraviolet radiation so that the adhesive may be de-activated, so that the carrier substrate 904 may be removed, in a subsequent processing operation.

Figures 9G, 9H, 9I, 9J:
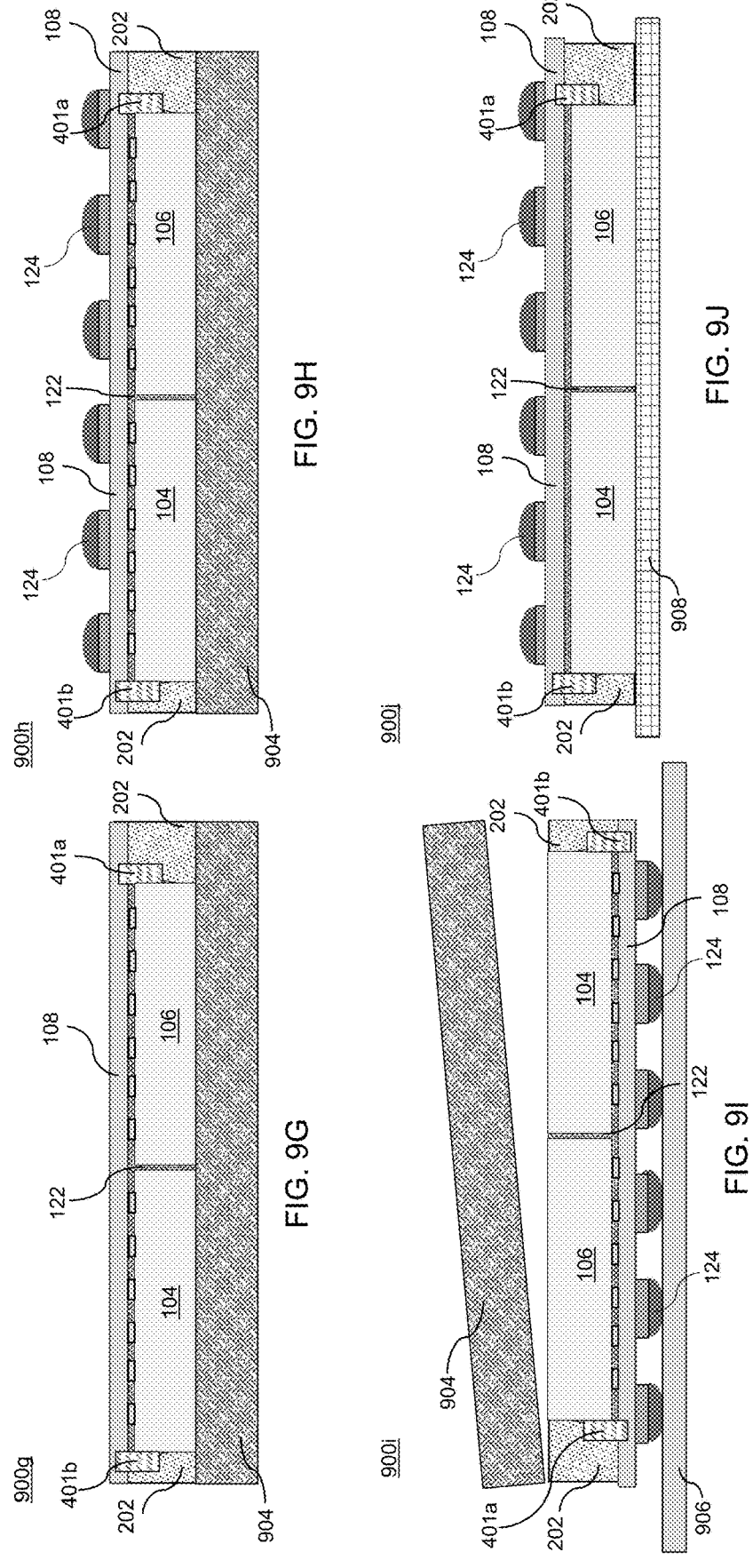
FIG. 9G is a vertical cross-sectional view of a further intermediate structure that may be used in the formation of a semiconductor package that includes a first die-interposer reinforcement structure and a second die-interposer reinforcement structure, according to various embodiments.
FIG. 9H is a vertical cross-sectional view of a further intermediate structure that may be used in the formation of a semiconductor package that includes a first die-interposer reinforcement structure and a second die-interposer reinforcement structure, according to various embodiments.
FIG. 9I is a vertical cross-sectional view of a further intermediate structure that may be used in the formation of a semiconductor package that includes a first die-interposer reinforcement structure and a second die-interposer reinforcement structure, according to various embodiments.
FIG. 9J is a vertical cross-sectional view of a further intermediate structure that may be used in the formation of a semiconductor package that includes a first die-interposer reinforcement structure and a second die-interposer reinforcement structure, according to various embodiments.

The intermediate structure 900g of FIG. 9G may be formed from the intermediate structure 900f by performing a wafer-thinning operation on the intermediate structure 900f. In this regard, a thickness of the interposer 108 may be reduced by performing a grinding and/or chemical mechanical polishing operation. The thinning operation may remove portions of an interposer substrate to thereby expose interconnect structures (not shown). A plurality of metal bumps 124 may then be formed over the interconnect structures of the interposer 108 to form the intermediate structure 900h of FIG. 9H. In this regard, a patterned photoresist (not shown) may be formed over interposer 108. The patterned photoresist may include openings corresponding to locations of metal bumps 124 that are to be formed. An electroplating process may then be performed to thereby form the metal bumps 124 over the interconnect structures of the interposer 108. The patterned photoresist may then be removed by ashing or by dissolution with a solvent. Solder material portions may then be formed over the metal bumps.

The intermediate structure 900i of FIG. 9I may be formed from the intermediate structure 900h by placing the intermediate structure 900h on a film frame 906 and removing the carrier substrate 904. The film frame 906 may be adhered to the metal bumps 124 of the intermediate structure 900h using an adhesive. The carrier substrate 904 may then be removed by de-activated the adhesive between the carrier substrate 904 and the semiconductor dies (104, 106). For example, as described above, the adhesive may be decomposed by application of a heat treatment or by application of ultraviolet radiation. Once the adhesive has been de-activated, the carrier substrate 904 may be removed The intermediate structure 900j of FIG. 9J may then be formed by attaching a dicing frame 908 to the semiconductor dies (104, 106) and removing the film frame 906. The dicing frame 908 may be attached to the intermediate structure 900i of FIG. 9I using, for example, a double-sided adhesive tape. In this regard, a first side of a double-sided adhesive tape may be applied to a surface of the dicing frame 908 and the semiconductor dies (104, 106) of the intermediate structure 900i may be brought into contact with a second side of the double-sided adhesive tape to thereby adhere the semiconductor dies (104, 106) to the dicing frame 908. The intermediate structure 900j may then be singulated to form a plurality of singulated intermediate structures 900j (i.e., semiconductor dies attached to the interposer 108) that may then be attached to a package substrate 110, as described in greater detail with reference to FIG. 9K, below.

Figures 9K, 9L, 9M:
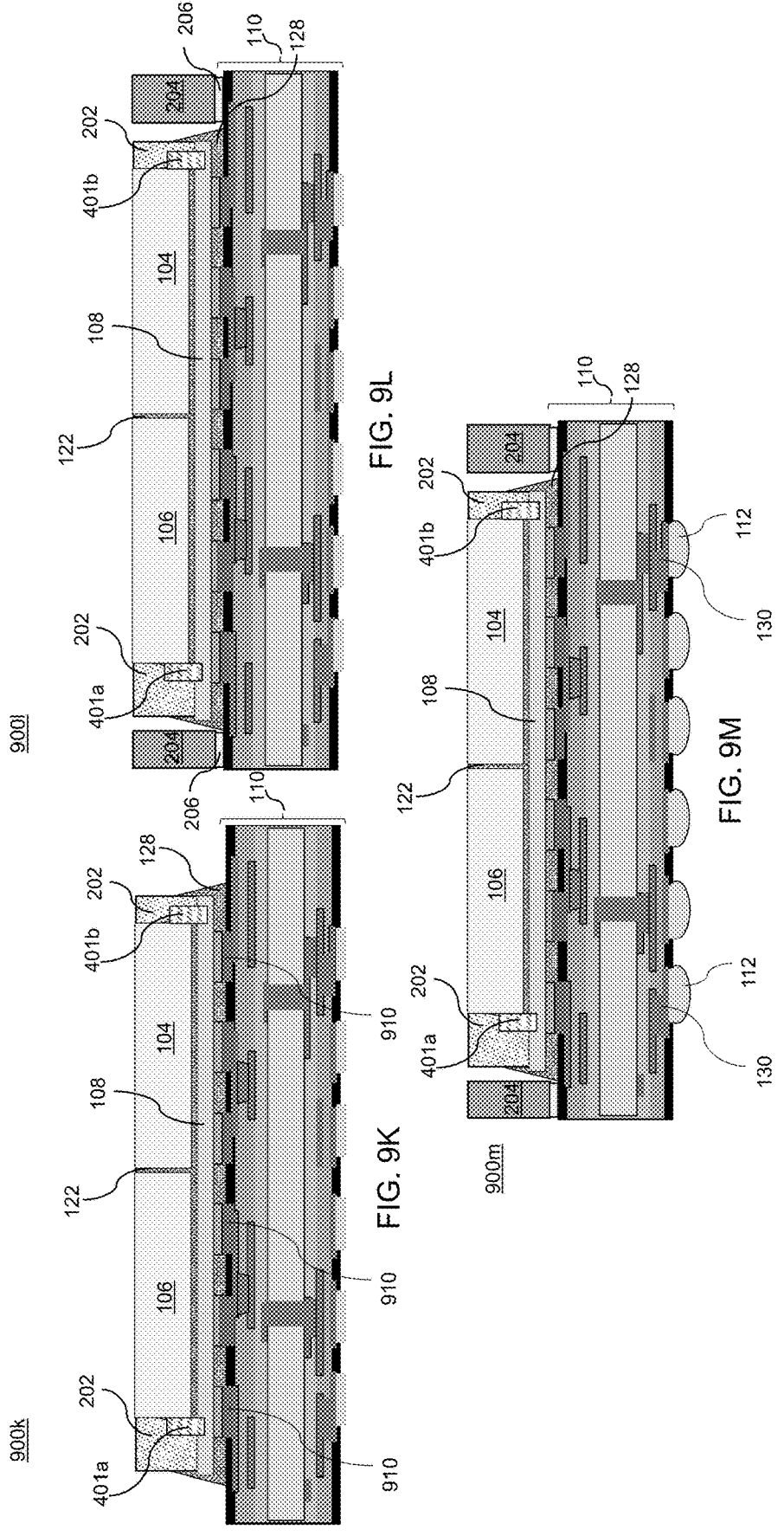
FIG. 9K is a vertical cross-sectional view of a further intermediate structure that may be used in the formation of a semiconductor package that includes a first die-interposer reinforcement structure and a second die-interposer reinforcement structure, according to various embodiments.
FIG. 9L is a vertical cross-sectional view of a further intermediate structure that may be used in the formation of a semiconductor package that includes a first die-interposer reinforcement structure and a second die-interposer reinforcement structure, according to various embodiments.
FIG. 9M is a vertical cross-sectional view of a further intermediate structure that may be used in the formation of a semiconductor package that includes a first die-interposer reinforcement structure and a second die-interposer reinforcement structure, according to various embodiments.

The intermediate structure 900k of FIG. 9K may be formed from the intermediate structure 900j of FIG. 9J by attaching the intermediate structure 900j to the package substrate 110. In this regard, the intermediate structure 900j may be positioned relative to the package substrate 110 such that the plurality of metal bumps 124 of the intermediate structure 900j is aligned with a respectively plurality of bonding pads 910 of the package substrate 110. A reflow operation may then be performed to melt solder portions formed on the plurality of metal bumps 124. Upon cooling, the solder portions may solidify to thereby bond the intermediate structure 900j to the package substrate 110 to thereby form the intermediate structure 900k of FIG. 9K.

The intermediate structure 900l of FIG. 9L may then be formed from the intermediate structure 900k by attaching the external reinforcement structure 204 to the intermediate structure 900k. In this regard, the external reinforcement structure 204 may be attached to the package substrate 110 with an adhesive 206 and may be formed of a metal, an insulator, a semiconductor, a ceramic, etc. For example, in one embodiment, the external reinforcement structure 204 may include copper at an atomic percentage greater than 80%, such as greater than 90% and/or greater than 95% although greater or lesser percentages may be used. As shown in FIG. 2A, the external reinforcement structure 204 may be configured as a ring located around a periphery of the package substrate 110. As such, the external reinforcement structure 204 may form a single structure. Alternatively, the external reinforcement structure 204 may include several disconnected portions (not shown). Further, the external reinforcement structure 204 need not be located near the periphery of the package substrate 110. Rather, the external reinforcement structure 204 may located on the package substrate 110 in any region that may be subject to mechanical distortions such as warping.

FIG. 9M is a vertical cross-sectional view of a further intermediate structure 900m that may be used in the formation of a semiconductor package that includes a first die-interposer reinforcement structure 401a and a second die-interposer reinforcement structure 401b, according to various embodiments. The intermediate structure 900m may be formed from the intermediate structure 900l by formation of solder material portions (i.e., solder ball 112) on bonding pads 130 of the package substrate 110. The intermediate structure 900m may then be attached to a support substrate 102 (e.g., see FIG. 1A) to thereby form a semiconductor package.

FIG. 10 is a flowchart illustrating various operations of a method 1000 of fabricating a semiconductor package (400 to 800b and 900m), according to various embodiments. In operation 1002, the method 1000 may include forming a cavity 902a in a top surface 404a of the interposer 108. In operation 1004, the method 1000 may include attaching a first semiconductor die 104 to an interposer 108. In operation 1006, the method 1000 may include forming a first reinforcement structure (e.g., first die-interposer reinforcement structure 401a) that is mechanically coupled to the interposer 108 and to the first semiconductor die 104. In this regard, forming the first reinforcement structure 401a, in operation 1006, may include filling the cavity 902a with an epoxy, acrylic, or an adhesive material and providing an additional amount of the epoxy, the acrylic, or the adhesive material such that the epoxy, the acrylic, or the adhesive material also contacts a surface 704a of the first semiconductor die 104.

In operation 1008, the method 1000 may further include curing the epoxy, the acrylic, or the adhesive material such that the first reinforcement structure 401a is formed as a solid structure having a modulus that is greater than 0.1 GPa and less than 1.0 GPa and such that the first reinforcement structure 401a is adhered to the interposer 108 and to the first semiconductor die 104 and has an adhesive strength that is greater than 5 N/mm2 and less than 10 N/mm2.

According to the method 1000, operation 1006 of forming the first reinforcement structure 401a may further include forming the first reinforcement structure 401a on a top surface 404a of the interposer 108 such that the first reinforcement structure 401a is partially overlapping with the first semiconductor die 104 in a plan view (e.g., see FIG. 8D). In this regard, the first reinforcement structure 401a may include a first portion 702a that extends laterally to a region external to the first semiconductor die 104 such that the first portion 702a is non-overlapping with the first semiconductor die 104 in the plan view (e.g., see FIG. 8D), and a second portion 702b of the first reinforcement structure 401a that is formed in a space between the top surface 404a of the interposer 108 and a bottom surface 704a of the first semiconductor die 104 such that the second portion 702b is overlapping with the first semiconductor die 104 in the plan view (e.g., see FIG. 8D). The method 1000 may further include attaching a second semiconductor die 106 to the interposer 108, and forming a second reinforcement structure (e.g., a second die-interposer reinforcement structure 401b or a interposer-substrate reinforcement structure 403; see FIG. 4) that is mechanically coupled to the interposer 108 and to at least one of the first semiconductor die 104 and the second semiconductor die 106.

Referring to all drawings and according to various embodiments of the present disclosure, a semiconductor package (400 to 800b and 900m) is provided. The semiconductor package (400 to 800b and 900m) may include an interposer 108, a first semiconductor die 104 electrically coupled to a first side of the interposer 108, and a first reinforcement structure (e.g., a first die-interposer reinforcement structure 401a) that is mechanically coupled to the interposer 108 and to the first semiconductor die 104. The first reinforcement structure 401a may be a solid structure that is adhered to the interposer 108 and to the first semiconductor die 104 and may have an adhesive strength that is greater than 5 N/mm$^2$ and less than 10 N/mm$^2$.

In one embodiment, the first reinforcement structure 401a may be formed at a corner or at an edge of the first semiconductor die 104. In one embodiment, the first reinforcement structure 401a may comprises epoxy, acrylic, or an adhesive material. In one embodiment, the first reinforcement structure 401a may comprise a modulus that is greater than 0.1 GPa and less than 1.0 GPa. In one embodiment, the first reinforcement structure 401a may comprises a bottom surface 402a formed below a top surface of the interposer 108 at a first distance d1, wherein the first distance d1 is greater than 0 microns and less than 100 microns. In one embodiment, the first reinforcement structure 401a may further extend above the top surface 404a of the interposer 108 to a second distance d2, wherein the second distance d2 is greater than 0 microns and less than 770 microns, and wherein the second distance d2 corresponds to a separation between the top surface 404a of the interposer 108 and a bottom surface 402a of the first semiconductor die 104 such that the first reinforcement structure 401a may be in contact with the bottom surface 704a of the first semiconductor die 104. In one embodiment, the first reinforcement structure 401a may further extend above the bottom surface 704a of the first semiconductor die 104 to a third distance d3, wherein the third distance d3 is greater than 0 microns and less than 770 microns and such that the first reinforcement structure 401a is in contact with a side surface of the first semiconductor die 104, and wherein a total thickness of the first reinforcement structure 401a is given by a fourth distance d4, wherein the fourth distance d4 equals a sum of the first distance d1, the second distance d2, and the third distance d3 and is greater than 0 microns and less than 870 microns. In one embodiment, the first reinforcement structure 401a may be formed on a top surface 404a of the interposer 108 and partially overlaps with the first semiconductor die 104 in a plan view such that the first reinforcement structure 401a comprises: a first portion 702a that extends laterally to a region external to the first semiconductor die 104 such as to be non-overlapping with the first semiconductor die 104 in the plan view; and a second portion of the first reinforcement structure 702b that is formed in a space between the top surface 404a of the interposer 108 and a bottom surface 704a of the first semiconductor die 104 such that the second portion 702b is overlapping with the first semiconductor die 104 in the plan view. In one embodiment, the first portion 702a comprises a first width w1, wherein the first width w1 is greater than 10 microns and less than 3 mm; and wherein the second portion 702*b* comprises a second width w2, wherein the second width is greater than 10 microns and less than 3 mm. In one embodiment, the first reinforcement structure 401*a* may be formed at a corner of the first semiconductor die 104 and comprises a first length L1 along a first direction and a second length L2 along a second direction, wherein the first length L1 is greater than 10 microns and less than 33 mm, and wherein the second length L2 is greater than 10 microns and less than 33 mm. In one embodiment, the semiconductor package may also include: a package substrate 110 electrically coupled to a second side of the interposer 108; and a second reinforcement structure 403 that is mechanically coupled to the interposer 108 and to the package substrate 110. In one embodiment, the semiconductor package may also include: a second semiconductor die 106 electrically coupled to the first side of the interposer 108; and another first reinforcement structure 401*b* that is mechanically coupled to the interposer 108 and to the second semiconductor die 106.

According to a further embodiment, a further semiconductor package (400 to 800*b* and 900*m*) is provided. The semiconductor package (400 to 800*b* and 900*m*) may include an interposer 108, a first semiconductor die 104 electrically coupled to a first side of the interposer 108, a package substrate electrically 110 coupled to a second side of the interposer 108, and a first reinforcement structure (e.g., a die-interposer reinforcement structure 401 or an interposer-substrate reinforcement structure 403) that may be mechanically coupled to the interposer 108 and to at least one of the first semiconductor die 104 and the package substrate 110.

In one embodiment, the semiconductor package may also include: a second semiconductor die 106 electrically coupled to the first side of the interposer 108; and another first reinforcement structure 401*b* that is mechanically coupled to the second semiconductor die 106, wherein the first reinforcement structure 401*a* is mechanically coupled to the first semiconductor die 104. In one embodiment, the first reinforcement structure 401*a* comprises an adhesive strength that is greater than 5 N/mm² and less than 10 N/mm² and modulus that is greater than 0.1 GPa and less than 1.0 GPa. In one embodiment, the first reinforcement structure 401*a* may be mechanically coupled to the first semiconductor die 104 and comprises a bottom surface 402*a* formed below a top surface 404*a* of the interposer 108; or the first reinforcement structure 401*a* may be mechanically coupled to the package substrate 110 and comprises a bottom surface 402*b* formed below the top surface 404*b* of the package substrate 110.

Another embodiment is drawn to a method of forming a semiconductor package. The method may include the operations of: attaching a first semiconductor die 104 to an interposer 108; and forming a first reinforcement structure 401 that may be mechanically coupled to the interposer 108 and to the first semiconductor die 104, wherein the first reinforcement structure 401 may be adhered to the interposer 108 and to the first semiconductor die 104 and comprises an adhesive strength that is greater than 5 N/mm² and less than 10 N/mm².

In one embodiment, the operation of forming the first reinforcement structure 401 may also include: forming a cavity 902*a*, 902*b* in a top surface 404*a* of the interposer 108; filling the cavity 902*a*, 902*b* with an epoxy, acrylic, or an adhesive material and providing an additional amount of the epoxy, the acrylic, or the adhesive material such that the epoxy, the acrylic, or the adhesive material also contacts a surface of the first semiconductor die 104; and curing the epoxy, the acrylic, or the adhesive material such that the first reinforcement structure 401 is formed as a solid structure comprising a modulus that is greater than 0.1 GPa and less than 1.0 GPa. In one embodiment, the operation of forming the first reinforcement structure may also include: forming the first reinforcement structure 401 on a top surface 404*a* of the interposer 108 such that the first reinforcement structure 401 is partially overlapping with the first semiconductor die 104 in a plan view such that the first reinforcement structure 401 includes: a first portion 702*a* that may extend laterally to a region external to the first semiconductor die 104 such that the first portion 702*a* is non-overlapping with the first semiconductor die 104 in the plan view; and a second portion 702*b* of the first reinforcement structure 401 that may be formed in a space between the top surface 404*a* of the interposer 108 and a bottom surface 704*a* of the first semiconductor die 104 such that the second portion 702*b* is overlapping with the first semiconductor die 104 in the plan view. In one embodiment, the method may also include: attaching a second semiconductor die 106 to the interposer 108; and forming a second reinforcement 401*b* structure that is mechanically coupled to the interposer 108 and to at least one of the first semiconductor die 104 and the second semiconductor die 106.

The various disclosed systems and methods provide advantages over existing semiconductor packages (100, 200) having semiconductor devices attached to interposers and semiconductor package substrates (e.g., see FIGS. 1A and 1B). In this regard, the disclosed embodiments provide improved methods for assembling semiconductor packages (400 to 800*b* and 900*m*) that overcome mechanical issues related to thermal expansion mismatch between package components that may otherwise lead to warpage, cracking, delamination, etc. Package substrates 110 may be reinforced with an external reinforcement structure 204 (e.g., see FIGS. 2A to 2C) that may reduce or eliminate warpage (e.g., see FIG. 1B) of the package substrate 110. Thermal expansion coefficient mismatch between the external reinforcement structure 204 and other components, however, may give rise to cracking, delamination, and other mechanical degradation of the semiconductor package 200 (e.g., see FIG. 2C). To counteract such thermal expansion issues, various disclosed embodiments may further provide reinforcement structures (401, 403) formed within the interposer 108 and/or package substrate 110 (e.g., see FIGS. 4 to 8D). The reinforcement structures (401, 403) may have a higher modulus and lower thermal expansion coefficient relative to other portions of the semiconductor package (400 to 800*b* and 900*m*) to thereby reduce or eliminate thermal-stress-induced damage to the semiconductor package (400 to 800*b* and 900*m*).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
an interposer;

a first semiconductor die electrically coupled to a first side of the interposer; and a first reinforcement structure that is mechanically coupled to the interposer and to the first semiconductor die, wherein the first reinforcement structure comprises a first bottom surface formed below a top surface of the interposer at a first distance d1, wherein the first reinforcement structure is in contact with at least one of a second bottom surface or a side surface of the first semiconductor die at a corner of the first semiconductor die, and wherein the first reinforcement structure further comprises an adhesive strength that is greater than 5 N/mm$^2$ and less than 10 N/mm$^2$.

2. The semiconductor package of claim 1, wherein the first reinforcement structure is formed at the corner or at the edge of the first semiconductor die.

3. The semiconductor package of claim 1, wherein the first reinforcement structure comprises epoxy, acrylic, or an adhesive material.

4. The semiconductor package of claim 1, wherein the first reinforcement structure comprises a modulus that is greater than 0.1 GPa and less than 1.0 GPa.

5. The semiconductor package of claim 1, wherein the first distance d1 is greater than 0 microns and less than 100 microns.

6. The semiconductor package of claim 5, wherein the first reinforcement structure further extends above the top surface of the interposer to a second distance d2, wherein the second distance d2 is greater than 0 microns and less than 770 microns, and wherein the second distance d2 corresponds to a separation between the top surface of the interposer and the second bottom surface of the first semiconductor die such that the first reinforcement structure is in contact with the second bottom surface of the first semiconductor die.

7. The semiconductor package of claim 6, wherein the first reinforcement structure further extends above the second bottom surface of the first semiconductor die to a third distance d3, wherein the third distance d3 is greater than 0 microns and less than 770 microns and such that the first reinforcement structure is in contact with the side surface of the first semiconductor die, and wherein a total thickness of the first reinforcement structure is given by a fourth distance d4, wherein the fourth distance d4 equals a sum of the first distance d1, the second distance d2, and the third distance d3 and is greater than 0 microns and less than 870 microns.

8. The semiconductor package of claim 1, wherein the first reinforcement structure is formed on the top surface of the interposer and partially overlaps with the first semiconductor die in a plan view such that the first reinforcement structure comprises:

a first portion that extends laterally to a region external to the first semiconductor die such as to be non-overlapping with the first semiconductor die in the plan view; and a second portion of the first reinforcement structure that is formed in a space between the top surface of the interposer and the second bottom surface of the first semiconductor die such that the second portion is overlapping with the first semiconductor die in the plan view.

9. The semiconductor package of claim 8, wherein the first portion comprises a first width w1, wherein the first width w1 is greater than 10 microns and less than 3 mm; and wherein the second portion comprises a second width w2, wherein the second width is greater than 10 microns and less than 3 mm.

10. The semiconductor package of claim 1, wherein the first reinforcement structure is formed at the corner of the first semiconductor die and comprises a first length L1 along a first direction and a second length L2 along a second direction, wherein the first length L1 is greater than 10 microns and less than 33 mm, and wherein the second length L2 is greater than 10 microns and less than 33 mm.

11. The semiconductor package of claim 1, further comprising:

a package substrate electrically coupled to a second side of the interposer; and a second reinforcement structure that is mechanically coupled to the interposer and to the package substrate.

12. The semiconductor package of claim 1, further comprising:

a second semiconductor die electrically coupled to the first side of the interposer; and another first reinforcement structure that is mechanically coupled to the interposer and to the second semiconductor die.

13. A semiconductor package, comprising:

an interposer;

a first semiconductor die electrically coupled to a first side of the interposer;

a package substrate electrically coupled to a second side of the interposer; and a first reinforcement structure that is mechanically coupled to the interposer and to at least one of the first semiconductor die and the package substrate, wherein the first reinforcement structure comprises a first bottom surface formed below at least one of a first top surface of the interposer or a second top surface of the package substrate at a first distance d1.

14. The semiconductor package of claim 13, further comprising:

a second semiconductor die electrically coupled to the first side of the interposer; and another first reinforcement structure that is mechanically coupled to the second semiconductor die, wherein the first reinforcement structure is mechanically coupled to the first semiconductor die.

15. The semiconductor package of claim 13, wherein the first reinforcement structure comprises an adhesive strength that is greater than 5 N/mm$^2$ and less than 10 N/mm$^2$ and modulus that is greater than 0.1 GPa and less than 1.0 GPa.

16. The semiconductor package of claim 13, wherein the first distance d1 is greater than 0 microns and less than 100 microns.

17. A semiconductor package, comprising:

an interposer;

a first semiconductor die attached to the interposer;

a second semiconductor die attached to the interposer and adjacent to the first semiconductor die;

a plurality of first reinforcement structures that are located at a corner of the first semiconductor die and the second semiconductor die; and a plurality of second reinforcement structures that are located at edges between the first semiconductor die and the second semiconductor die, wherein each of the plurality of reinforcement structures and the plurality of second reinforcement structures comprise a bottom surface formed below a top surface of the interposer at a first distance d1.

18. The semiconductor package of claim 17, wherein the plurality of first reinforcement structures and the plurality of second reinforcement structures each comprises an adhesive strength that is greater than 5 N/mm$^2$ and less than 10 N/mm$^2$ and modulus that is greater than 0.1 GPa and less than 1.0 GPa.

19. The semiconductor package of claim 17, wherein a subset of the plurality of first reinforcement structures are mechanically coupled to the first semiconductor die, a second subset of the plurality of first reinforcement structures are mechanically coupled to the second semi-conductor die, the plurality of second reinforcement structures are mechanically coupled to both the first semiconductor die and the second semiconductor die, and wherein the first distance d1 is greater than 0 microns and less than 100 microns.

20. The semiconductor package of claim 17, wherein the interposer is attached to a package substrate such that the first semiconductor die and the second semiconductor die are electrically connected to the interposer and the package substrate.

* * * * *